US00RE42955E

(19) United States
(12) Reissued Patent
Gunter et al.

(10) Patent Number: US RE42,955 E
(45) Date of Reissued Patent: Nov. 22, 2011

(54) GAN-BASED PERMEABLE BASE TRANSISTOR AND METHOD OF FABRICATION

(75) Inventors: Liberty L. Gunter, Hudson, NH (US); Kanin Chu, Nashua, NH (US); Charles R. Eddy, Jr., Columbia, MD (US); Theodore D. Moustakas, Dover, MA (US); Enrico Bellotti, Watertown, MA (US)

(73) Assignee: BAE Systems Information and Electronic Systems Integration Inc., Nashua, NH (US)

(21) Appl. No.: 12/268,515

(22) PCT Filed: Oct. 1, 2004

(86) PCT No.: PCT/US2004/032276

§ 371 (c)(1), (2), (4) Date: Apr. 22, 2005

(87) PCT Pub. No.: WO2005/062365

PCT Pub. Date: Jul. 7, 2005

Related U.S. Patent Documents

Reissue of:
(64) Patent No.: 7,413,958
Issued: Aug. 19, 2008
Appl. No.: 10/532,456
Filed: Apr. 22, 2005

U.S. Applications:
(60) Provisional application No. 60/527,238, filed on Dec. 4, 2003.

(51) Int. Cl.
*H01L 21/302* (2006.01)
*H01L 21/331* (2006.01)
*H01L 21/461* (2006.01)

(52) U.S. Cl. ..... 438/347; 438/172; 438/342; 438/718; 438/173; 257/E21.246; 257/E21.402; 257/E21.22

(58) Field of Classification Search ..... 438/172, 438/173, 342, 347, 718, 350, 951, FOR. 165, 438/FOR. 179, FOR. 419, FOR. 447, FOR. 455; 257/E21.22, E21.246, E21.402
See application file for complete search history.

(56) References Cited

U.S. PATENT DOCUMENTS

| | | | | |
|---|---|---|---|---|
| 3,966,501 | A | 6/1976 | Nomura et al. | |
| 4,224,361 | A * | 9/1980 | Romankiw | 427/259 |
| 4,510,016 | A * | 4/1985 | Chi et al. | 438/347 |
| 4,701,996 | A * | 10/1987 | Calviello | 438/173 |
| 5,006,488 | A * | 4/1991 | Previti-Kelly | 438/670 |
| 5,175,597 | A * | 12/1992 | Cachier et al. | 257/267 |
| 5,215,619 | A * | 6/1993 | Cheng et al. | 156/345.42 |
| 5,270,554 | A * | 12/1993 | Palmour | 257/77 |

(Continued)

OTHER PUBLICATIONS

Gunter, Liberty Lewis, "Process Design and Development of a Gallium Nitride Permeable Base Transistor", Boston University College of Engineering, 2002, 134 pages.

(Continued)

*Primary Examiner* — Matthew Smith
*Assistant Examiner* — Quovaunda Jefferson
(74) *Attorney, Agent, or Firm* — Vern Maine & Associates; Andrew Paul Cernota

(57) ABSTRACT

An etched grooved GaN-based permeable-base transistor structure is disclosed, along with a method for fabrication of same.

14 Claims, 43 Drawing Sheets

U.S. PATENT DOCUMENTS

| | | | | |
|---|---|---|---|---|
| 5,571,732 | A * | 11/1996 | Liu | 438/312 |
| 5,895,260 | A * | 4/1999 | Bhatnagar et al. | 438/571 |
| 5,929,467 | A * | 7/1999 | Kawai et al. | 257/192 |
| 6,051,503 | A * | 4/2000 | Bhardwaj et al. | 438/705 |
| 6,156,581 | A * | 12/2000 | Vaudo et al. | 438/22 |
| 6,410,396 | B1 | 6/2002 | Casady et al. | |
| 6,533,874 | B1 | 3/2003 | Vaudo et al. | |
| 6,545,340 | B1 | 4/2003 | Higgs et al. | |
| 6,690,042 | B2 * | 2/2004 | Khan et al. | 257/192 |
| 2002/0117685 | A1 | 8/2002 | Mochizuki et al. | |
| 2002/0190273 | A1 * | 12/2002 | Delage et al. | 257/197 |
| 2003/0015708 | A1 * | 1/2003 | Parikh et al. | 257/73 |
| 2003/0151046 | A1 * | 8/2003 | Brar et al. | 257/48 |
| 2004/0023508 | A1 * | 2/2004 | Chinn et al. | 438/710 |

OTHER PUBLICATIONS

PCT International Search Report dated Apr. 7, 2005 of International Application No. PCT/US04/32276 filed Oct. 1, 2004.

Nishizawa, Jun-Ichi et al., "The 2.45 GHz 36 W CW Si Recessed Gate Type SIT with High Gain and High Voltage Operation", IEEE Transactions On Electronic Devices, Feb. 2000, pp. 482-487, vol. 47, No. 2.

Henning, J.P. et al., "A Novel Self-Aligned Fabrication Process for Microwave Static Induction Transistors in Silicon Carbide", IEEE Electron Device Letters, Dec. 2000, pp. 578-580, vol. 21, No. 12.

Bunea, Gabriela E. et al., "Modeling of a GaN Based Static Induction Transistor", Dept. of Physics, Electrical and Computer Engineering, Boston University, pp. 1-6, Boston, MA, (No date).

Camarchia, Vittorio et al. "Physics-Based Modeling of Submicron GaN Permeable Base Transistors", IEEE Electron Device Letters, Jun. 2002, pp. 303-305, vol. 23, No. 6.

Misra M. et al. "Investigation of vertical transport in n-GaN films grown by molecular beam epitaxy using Schottky barrier diodes", Applied Physics Letters, Feb. 21, 2000, pp. 1045-1047, vol. 76, No. 8. American Institute of Physics.

Bozler, Carl O. et al. "Fabrication and Numerical Simulation of the Permeable Base Transistor", IEEE, 1980, pp. 1-14.

* cited by examiner

View 1

GAN-BASED PERMEABLE BASE TRANSISTOR AND METHOD OF FABRICATION

Matter enclosed in heavy brackets [ ] appears in the original patent but forms no part of this reissue specification; matter printed in italics indicates the additions made by reissue.

RELATED APPLICATIONS

This application *is a U.S. National Phase Application of PCT Application No. PCT/US2004/032276, filed Oct. 1, 2004, which* claims the benefit of U.S. Provisional Application No. 60/527,238, filed Dec. 4, 2003, *both of* which [is] *are* herein incorporated in [its] *their* entirety by reference.

FIELD OF THE INVENTION

The invention relates to transistors, and more particularly, to permeable base transistors.

BACKGROUND OF THE INVENTION

There is increasing need for new devices that can operate at frequencies greater than 1 GHz. The wide bandgap semiconductor gallium nitride (GaN) has received much interest in the last decade as a material for high efficiency, high power microwave devices due to its high breakdown field and electron saturation velocity, and low thermal generation rate. Unfortunately, there is no native substrate on which to grow GaN device epilayers, hence the films are grown heteroepitaxially on sapphire or silicon carbide substrates.

Such growth results in films with considerable vertical threading dislocation densities that limit electron mobility in lateral devices such as metal semiconductor field effect transistors (MESFETs) or high electron mobility transistors (HEMTs). Yet the vertical mobility is enhanced. This physical attribute together with the material properties previously mentioned makes GaN a highly suitable material for a permeable base transistor (PBT).

The PBT is device very similar to the MESFET but with vertical transport instead of lateral, and has received much attention in the last quarter of a century due to its potential as a high power, high frequency, and high temperature-operating device. PBTs were suggested as early as 1964, and are typically fabricated using silicon, cobalt disilicide, gallium arsenide, silicon carbide, nickel phthalocyanine, and copper phthalocyanine.

Due to the early stage of development in the GaN growth and understanding of the material properties, PBTs fabricated with GaN have only recently been attempted. Reported modeling simulations of a GaN based PBT with a cut-off frequency ($f_T$) as high as 24.8 GHz and maximum frequency of oscillation ($f_{max}$) of 75.2 GHz. Such performance is relatively limited.

What is needed, therefore, techniques for making high power GaN PBTs using GaN.

SUMMARY OF THE INVENTION

One embodiment of the present invention provides an etched grooved GaN-based permeable-base transistor device. The device includes a GaN emitter region (e.g., having a thickness of about 6 to 10 μm) that is grown (e.g., on (0001) sapphire) using hydride vapor-phase epitaxy (HVPE). This emitter region may further include He implantation under base and collector contact pads to provide pad isolation (e.g., implant angle of about 7°). The device further includes a GaN base region (e.g., having a thickness of about 1 to 2 μm) that is grown on the GaN emitter region using molecular beam epitaxy (MBE). The device further includes a GaN collector region (e.g., having a thickness of about 0.1 to 0.3 μm) that has a plurality of collector fingers The collector region is grown on the GaN base region using MBE. In one such particular embodiment, the collector fingers have finger sidewall angles of about 80° to 85° for 1:1 and 1:3 finger spacing. In another particular such embodiment, the collector region has a collector pad region and a plurality of collector fingers, wherein the collector fingers have a first height in the collector pad region and a second height out of the collector pad region, with the first and second heights configured so as to prevent disconnect between the collector fingers and the collector pad region. For instance, the difference in the first and second heights could be the thickness of one layer of collector pad metal.

Another embodiment of the present invention provides a method for fabricating an etched grooved GaN-based permeable-base transistor device. One such embodiment of the method includes seven mask levels, including: Level 1—He implant mask; Level 2—nitride isolation pad; Level 3—collector ohmic pad mask; Level 4—e-beam lithography of collector fingers for liftoff; Level 5—base recess and metallization; Level 6—emitter and device isolation etch, emitter ohmic; and Level 7—microwave test pad metal deposition. Note that not all seven masks need to be used in practicing other embodiments of the present invention.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 1b is a vertical cross sectional view of the GaN PBT device shown in FIG. 1a.

Figure 1B:
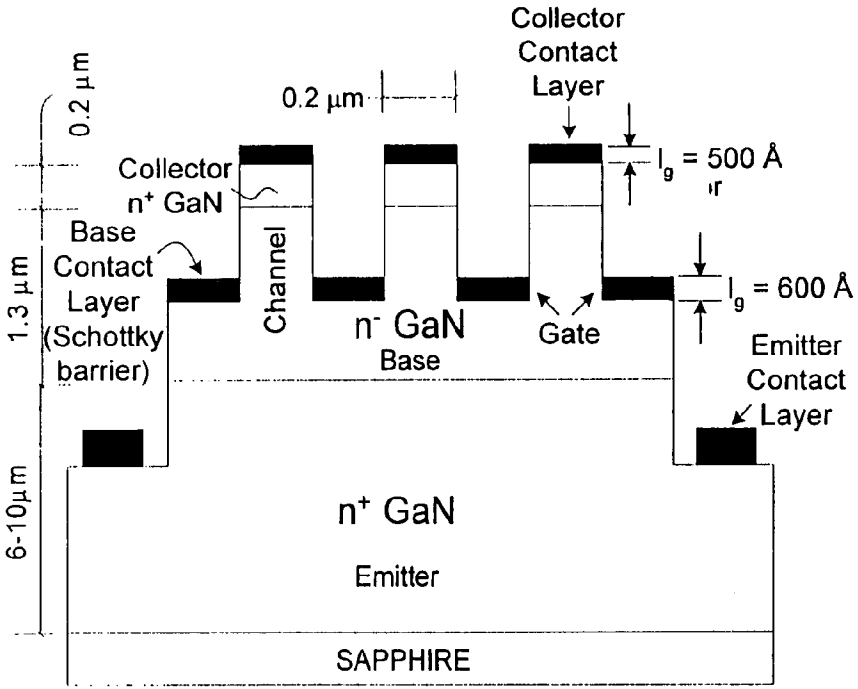

Note that the various features shown in the Figures are not drawn to any particular scale. Rather, the Figures are drawn to emphasize features and structure for purposes of explanation. The actual geometries and scale of the pertinent features and structure will be apparent in light of this disclosure.

DETAILED DESCRIPTION OF THE INVENTION

Embodiments of the present invention provide a design and method of fabrication of an etched grooved GaN-based permeable-base transistor structure. Process flow details regarding passivation, active region dry etching, and a mask set designed for PBT fabrication are disclosed. The mask set is configured to provide discrete PBT devices with a range of geometries for different frequency and power level operation, and high quality metal contacts to the various GaN layers.

One particular embodiment is fabricated using n-type GaN grown by hydride vapor phase epitaxy (HVPE) and molecular beam epitaxy on thick HVPE GaN quasi-substrates. The fabrication process employs isolation pads via helium (He) implantation and silicon nitride (SiN) deposition, as well as sub-micron chlorine-based high density inductively coupled plasma (ICP) etching of collector fingers patterned via e-beam lithography. Base Schottky contacts are deposited on the etched GaN layer prior to ohmic metal deposition so Schottky contacts on dry etched surfaces as well as low temperature annealed (0–500° C.) Schottky and ohmic contacts are characterized for their performance.

The resulting high power GaN PBT device has a cutoff frequency $f_T$ of about 134 GHz and a maximum frequency $f_{max}$ of about 500 GHz. The device has a breakdown voltage of about 50V and a $g_m$ of 70 mS/mm. Analysis of the device topology shows smooth etched finger structures and base layer surface with finger sidewall angles of about 80° to 85° for 1:1 and 1:3 finger spacing. Specific contact resistivities of about $3\times10^{-6}\Omega\cdot cm^2$ for the ohmic contacts were achieved with Ti/Al/Ni/Au metallization scheme. DC testing of these example devices show a current density $J_S$ as high as 518 $mA/mm^2$, and a collector current $I_C$ of about 140 mA/mm, both at $V_{CE}$ of 5V and $V_{BE}$ of +0.5V. The transconductance achieved is about 111 mS/mm in the measured collector-emitter bias range. These actual results are comparable, within the measurement tolerance, to physics-based modeling results.

Other configurations will be apparent in light of this disclosure. In any such cases, a GaN PBT is provided that combines the high breakdown field of GaN and the good frequency response of a PBT. Applications for use include, for example, millimeter-wave power applications.

PBT Structure

Generally, there are two types of PBTs: etched groove and embedded or overgrown. In the case of etched groove, many submicrometer bases lay in etched grooves between ridge-like emitter contacts. In the case of embedded or overgrown, the base is completely buried inside the semiconductor lattice by epitaxial regrowth of the semiconductor. Embodiments of the present invention are directed to the etched groove type PBT.

The operation of the PBT is very similar to that of the MESFET except that the PBT is a vertical device and the MESFET is a lateral carrier device. In the PBT, the current flows perpendicular to the material surface. With this type of device, the thickness of the grown material layers can be altered to vary the device characteristics. In addition, the PBT is unipolar with a relatively short base length compared to the base length of a MESFET.

Figure 1A:
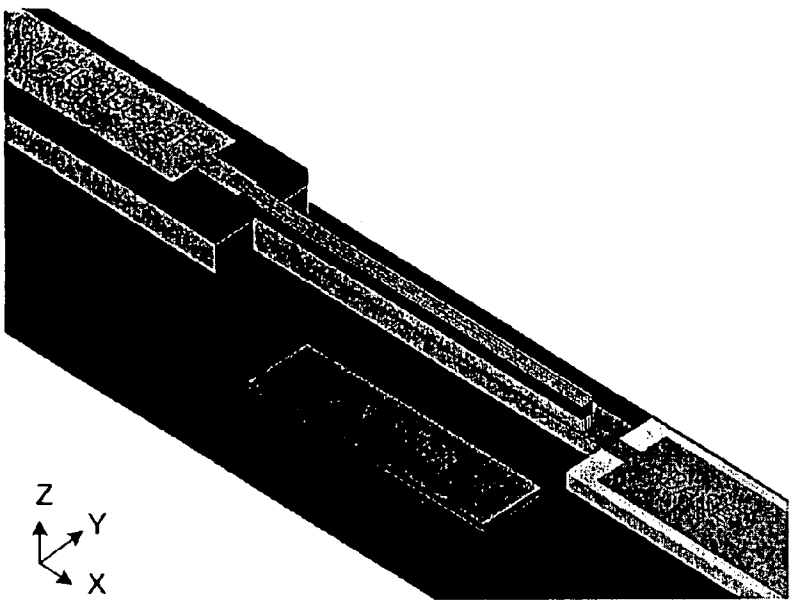
FIG. 1a is a side and top perspective view of a GaN PBT device configured in accordance with an embodiment of the present invention.

FIGS. 1a and 1b illustrate an etched groove PBT with metal contact configured in accordance with one embodiment of the present invention. To fabricate an etched groove PBT with suitable electrical characteristics, two conditions should be met: the spacing between metal fingers should be such that the two depleted zones meet (e.g., spacing between metal fingers smaller than 1 μm); and the leakage current of both base-collector and base-emitter Schottky diodes should be minimized. This requires a relatively large Schottky barrier height ($\Phi_B$>1 eV) on the material with which it is in contact. This submicrometer-periodicity Schottky-barrier grating is used to modulate the vertical flow of electrons.

As shown in FIGS. 1a and 1b, the top ohmic layer serves as the collector contact (on top of the device fingers). The bottom and middle ohmic layers serve as the emitter and base contacts, respectively, which are deposited in two separate etched regions. Since the gate length ($l_g$) is defined by the thickness of the Schottky metal in the base region, $l_g$ can be realistically fabricated as smaller than 0.1 μm (the limit of most conventional transistors). Because of this, the effective channel length is mainly controlled by the depletion width towards collector and emitter.

The device was fabricated starting from a GaN quasi-substrates (e.g., 6 to 10 μm) grown on (0001) sapphire using a hydride vapor-phase epitaxy (HVPE) reactor. Note that this GaN quasi-substrate layer also serves as the emitter region for the PBT. In one embodiment, this layer is auto-doped n-type with a silicon (Si) carrier concentration of about $5\times10^{18}$ $cm^{-3}$. Atomic force microscopy (AFM) studies on the GaN quasi-substrates show a step-flow growth mode with atomically smooth terraces or "fingers" of 0.2 μm width and step-height of 2 monolayers. RMS roughness of 0.45 nm was obtained over a 10×10 μm area.

The base and collector epilayers of this embodiment are 1.3 μm and 0.2 μm thick, respectively. The layers can be grown by plasma-enhanced molecular beam epitaxy (MBE) carried out, for example, in a Varian [Genii] *GenII* system. Other such systems can be used here as well. Seamless epitaxy of GaN via MBE on GaN quasi-substrates can be achieved by growing the epilayers in group III-rich conditions. These base and emitter layers replicate the underlying GaN quasi-substrate layer without renucleation. The base and collector layers are doped with silicon (Si) to carrier concentrations of $5\times10^{16}$ and $5\times10^{18}$, respectively.

When the PBT is in ON condition, the majority carriers flow from emitter (held at ground potential) to collector (biased at positive potential). Under normal operation, the Schottky barrier is reverse-biased by a negative base-to-emitter voltage. A voltage dependent depletion region forms beneath the Schottky barrier. This constricts the effective area of the n-channel (reducing the depletion region on either side of the emitter finger), causing the channel to open and the collector current to vary with applied base bias.

In a PBT, the base bias induces a potential barrier under the collector. Near pinch-off, electrons that are injected from the emitter are accelerated by the collector bias, and pass across the potential barrier. At higher collector biases, the thermionic emission current rises exponentially with applied collector bias eventually becoming space charge limited, resulting in a triode mode device operation, where the collector current does not saturate at high collector voltages.

When a negative bias is applied to the collector, the depletion region expands and current flow through the channel is restricted. This will ultimately result in pinch off of the chan nel, and turn off of the PBT. Pinch off can be approximated using the equation:

$$V = \frac{1qNa^2}{2\varepsilon_r\varepsilon_0}$$

where q is the charge of an electron, a is the channel thickness (or, in the case of a PBT, half the width of 1 finger), ∈(r) is the relative permittivity of the material, and ∈(0) is the permittivity of vacuum.

Fabrication Methodology

FIGS. 3a through 7 demonstrate a process flow for the fabrication of a GaN PBT in accordance with one embodiment of the present invention. This process flow includes all steps required to fabricate the device, as well as the design of a photolithography mask set drawn using AutoCAD. Various process alternatives are also provided.

Figure 2A:
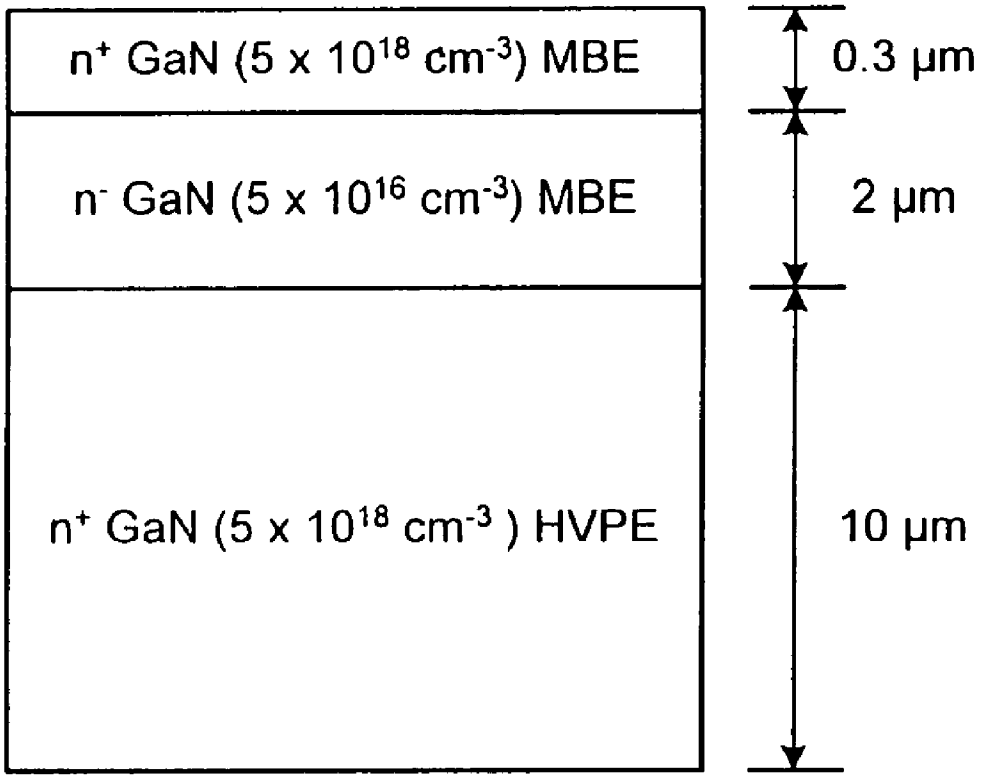
FIG. 2a demonstrates the material structure of a GaN PBT device configured in accordance with an embodiment of the present invention.

The GaN PBT, because it is based on vertical transport, has three distinctly doped layers versus the two of lateral transistor devices for the metal contacts and the device itself to perform optimally. The material structure to be employed in the GaN PBT, in accordance with one embodiment of the present invention, is shown in FIG. 2a.

Due to the lattice mismatch of GaN grown on sapphire or SiC, the bottom $n^+$ layer is deposited thick (e.g., $n^+5\times10^{18}$ $cm^{-3}$, HVPE) to keep the vertical threading dislocations minimal The layer structure is chosen because the heavily doped regions will be used for ohmic contacts and the lightly doped region will be used for a Schottky contact to adequately pinch off for a given range of high frequency operation. The desired blocking voltage of the transistor determines the thick n-region. The final structure will look similar to that shown in FIG. 1b, where the material layers are the same as in FIG. 2a.

Note that a full PBT will have a plurality of the collector fingers, and is this particular case. Only three are shown in FIG. 1b for the purpose of illustration. In one particular embodiment, the full PBT device has 20 collector fingers, each surrounded by two base regions to control the width of the channel, as shown in FIG. 1b. It will be appreciated that, in developing a process for a PBT device, it is necessary to have tolerances to variability in the semiconductor material characteristics and fabrication process. Some tolerances that are used herein are passivation layers, implantation, and pre-metal deposition treatments.

Figure 2B:
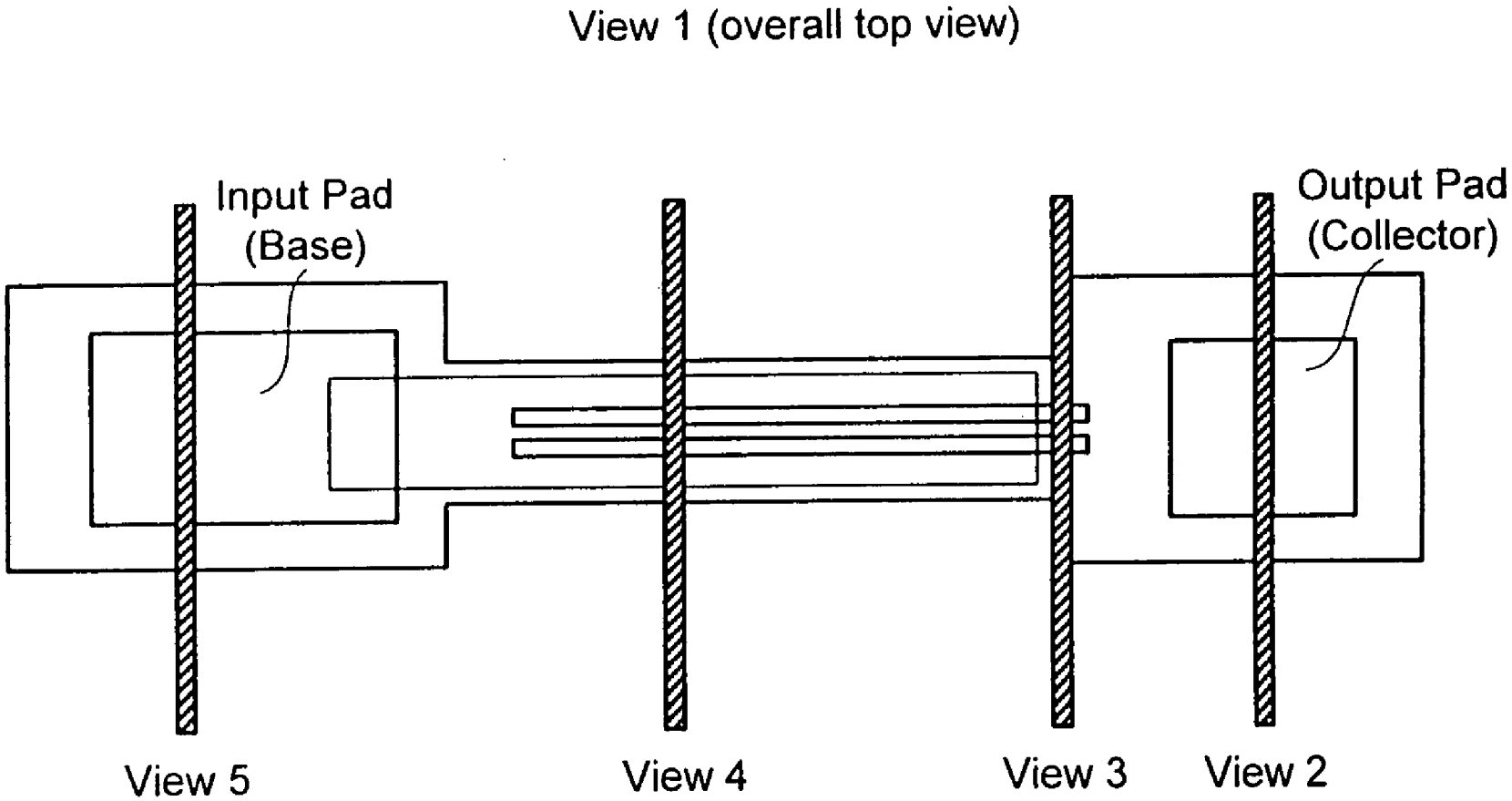
FIG. 2b illustrates various views of a GaN PBT device used to illustrate fabrication processes configured in accordance with an embodiment of the present invention.

When referring to example embodiments of the PBT process described herein, the following views shall be discussed and are illustrated in FIG. 2b: view 1 is the overall top view; view 2 is the cross section through the collector RF probe pad; view 3 is the cross section through the collector ohmic pad; view 4 is the cross section through the base collector fingers; and view 5 is the cross section through the base RF probe pad.

This is a seven-mask process flow that is the baseline for all of the subsequent versions. Various modifications and details not included in this version will be apparent in light of this disclosure.

This particular embodiment begins with the HVPE growth of 10 μm of heavily doped (e.g., $2\times10^{18}$ $cm^{-3}$ to $5\times10^{18}$ $cm^{-3}$) n-GaN followed by 2 μm of MBE grown, lightly doped (e.g., $2\times10^{16}$ $cm^{-3}$ to $5\times10^{16}$ $cm^{-3}$) n-GaN and 0.3 μm of MBE grown, highly doped (e.g., $2\times10^{18}$ $cm^{-3}$ to $5\times10^{18}$ $cm^{-3}$) n-GaN. The silicon nitride deposition (to be discussed in turn) is to passivate the sidewalls of the collector fingers to prevent shorting of the base to the collector if metal accidentally deposits on the sidewalls.

The mask levels for this example process are shown here in Table 1:

TABLE 1

| | |
|---|---|
| Level 1 | He implant mask |
| Level 2 | Nitride isolation pad |
| Level 3 | Collector ohmic pad mask |
| Level 4 | E-beam lithography of collector fingers for liftoff |
| Level 5 | Base recess and metallization |
| Level 6 | Emitter and device isolation etch, emitter ohmic |
| Level 7 | Microwave test pad metal deposition |

The process flow will now be discussed in steps, and with reference to the FIGS. 3a through 7. Note that the following steps are not necessarily intended to implicate any rigid order of performance, and other embodiments may have the steps performed in a different order, with a similar end product produced.

Step 1: Perform RCA wafer clean. The purpose of the RCA wafer clean is to remove organic contaminants (e.g., dust particles, grease or silica gel) from the wafer surface, as well as any oxide layer that may have built up, and any ionic or heavy metal contaminants.

Figure 3A:
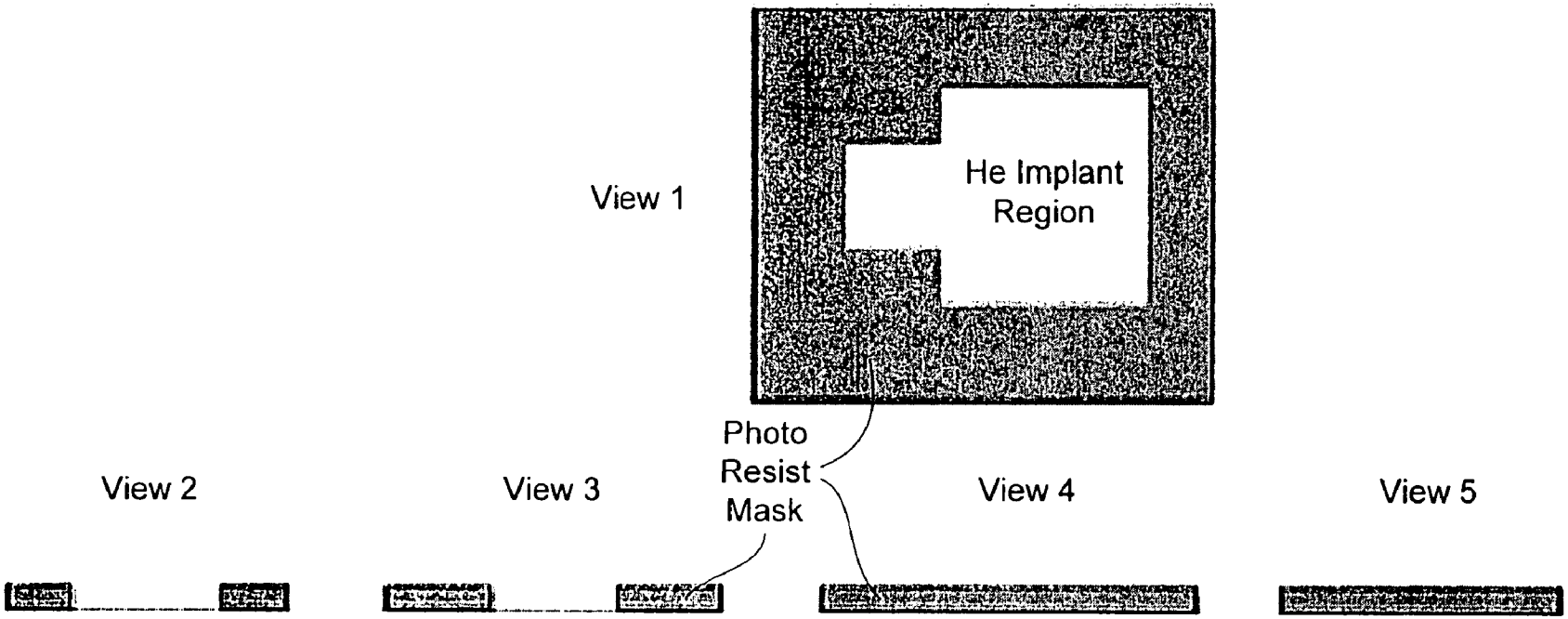
FIGS. 3a through 7 illustrate a seven mask process flow for fabricating an GaN PBT and variations thereof in accordance with an embodiment of the present invention.

Step 2: Open windows for helium (He) implantation using optical lithography. Due to the fact that the PBT is a "normally-on" device, the semiconductor material is conducting by default. Thus, an insulating layer is used to isolate the pads from the device. In this particular embodiment, the insulating layer is provided with He implantation. FIG. 3a shows the optical lithography for He implantation of this step. As can be seen, the photo resist (PR) is shown is each of the views in locations where no He implantation is desired. In one particular embodiment, the wafer is patterned with about 9 μm photo resist for the He implantation.

Figure 3B:
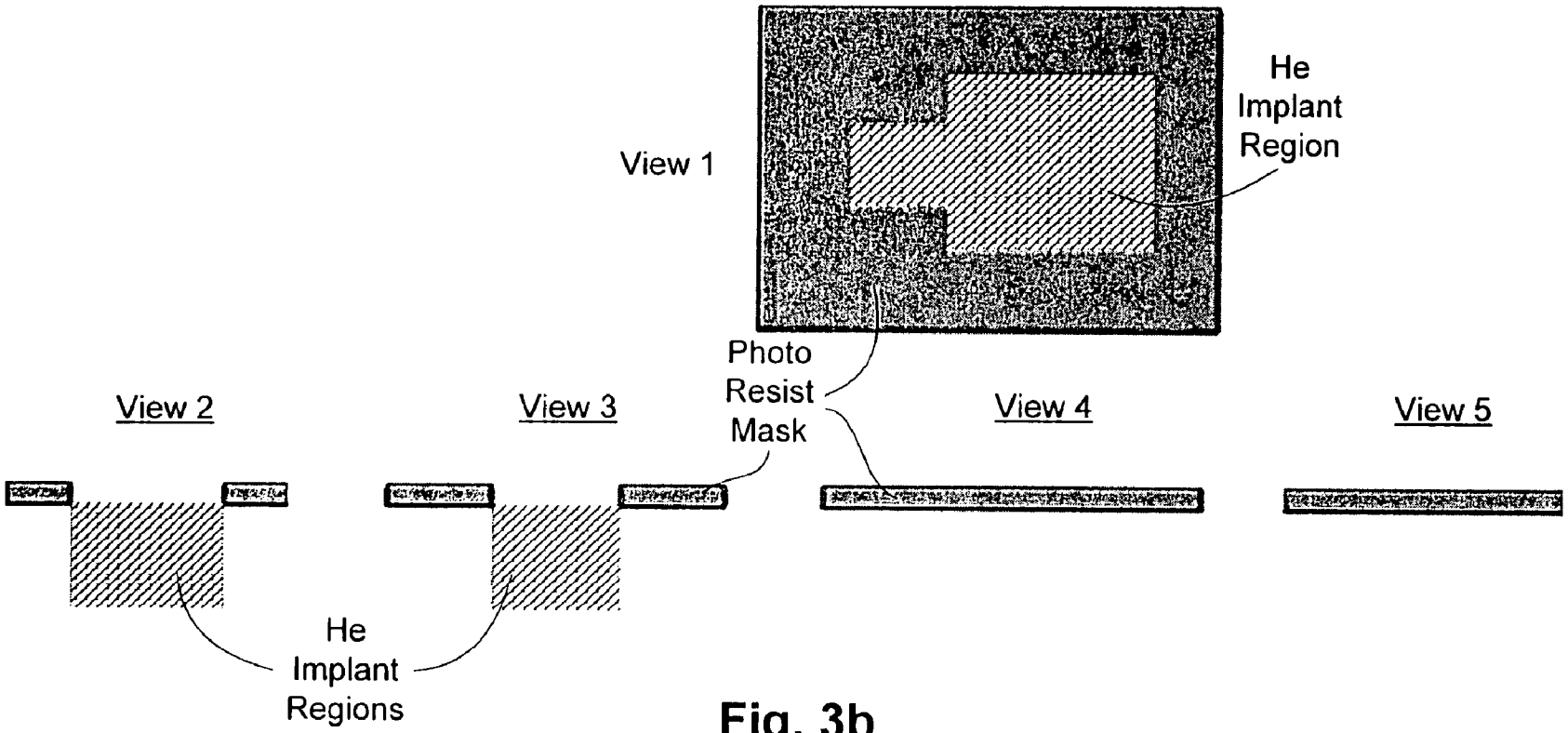

Step 3: Perform $He^{2+}$ implantation at about 250 keV, 1.35 μm isolation depth (determined from a TRIM calculation). FIG. 3b shows the locations of He implantation with the diagonal striping. In one particular embodiment, a dose of about $1\times10^{15}$ $cm^{-3}$ was targeted with an acceleration voltage of 180 keV at an implant angle of 7°. With these parameters, TRIM simulations estimated an implant depth of about 2 μm.

Figure 3C:
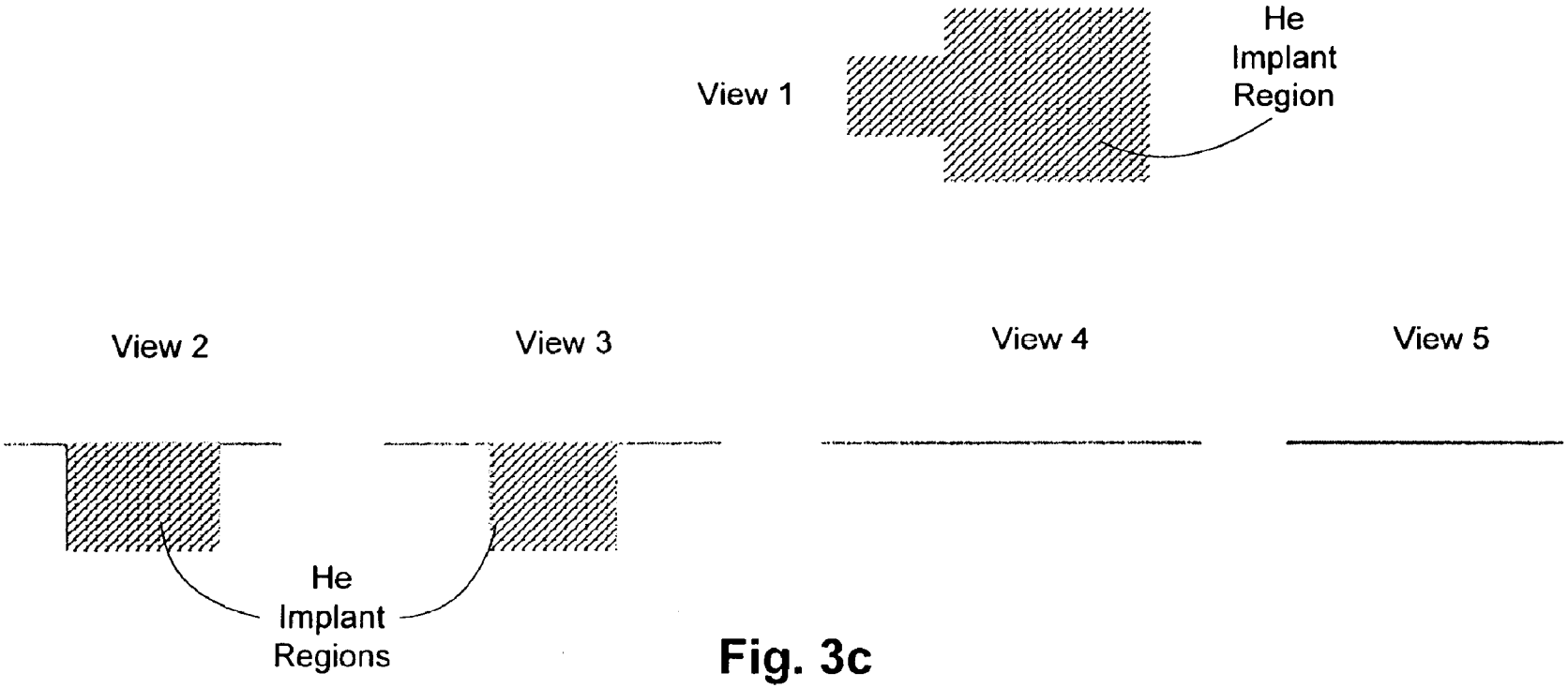

Step 4: Strip the photo resist mask. The resulting structure after stripping is shown in FIG. 3c.

Figure 3D:
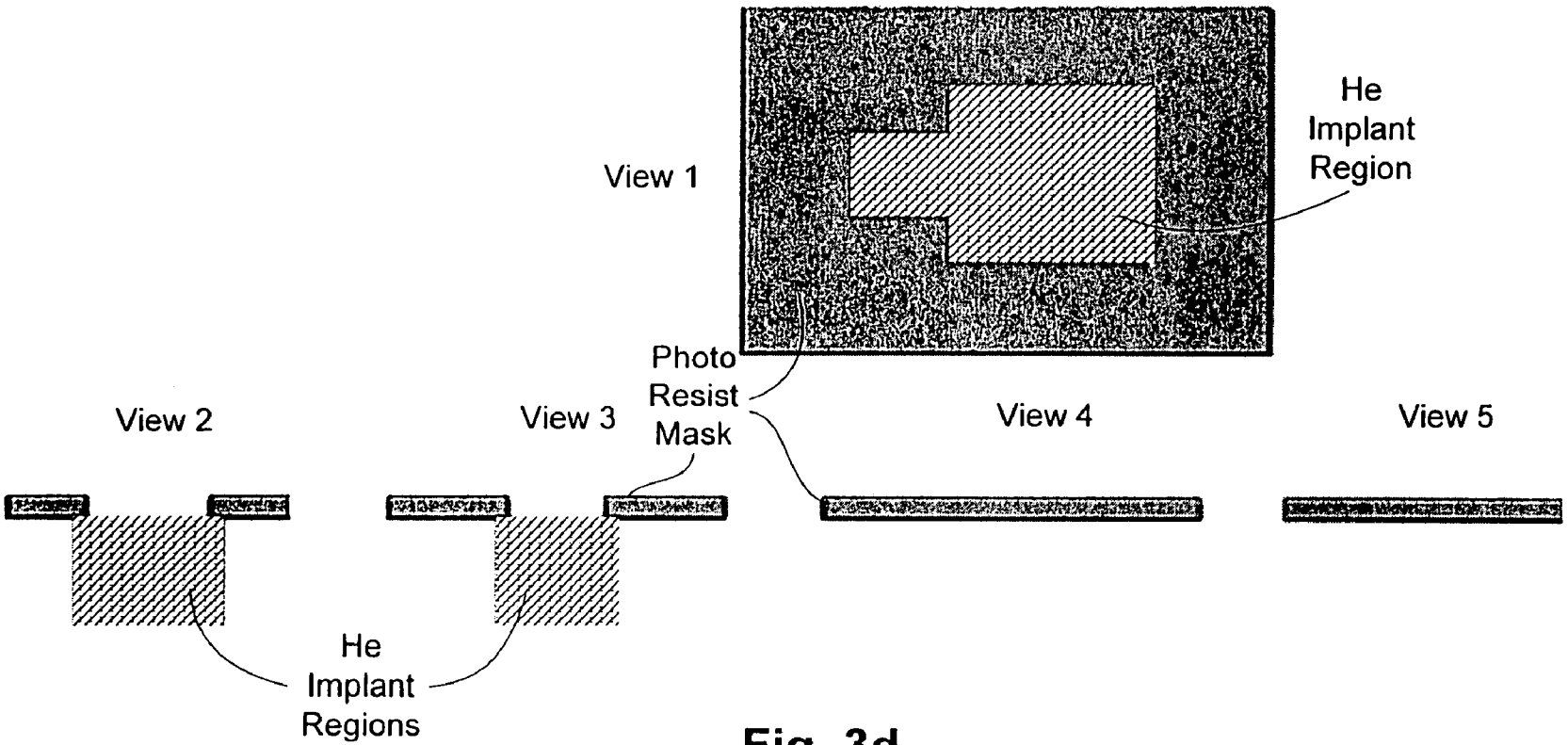

Step 5: Open windows for thin, high quality silicon nitride pad ($SiN_x$), about 1000–2000 Å thick, using optical lithography. FIG. 3d shows the optical lithography for the $SiN_x$ pad of this step.

Figure 3E:
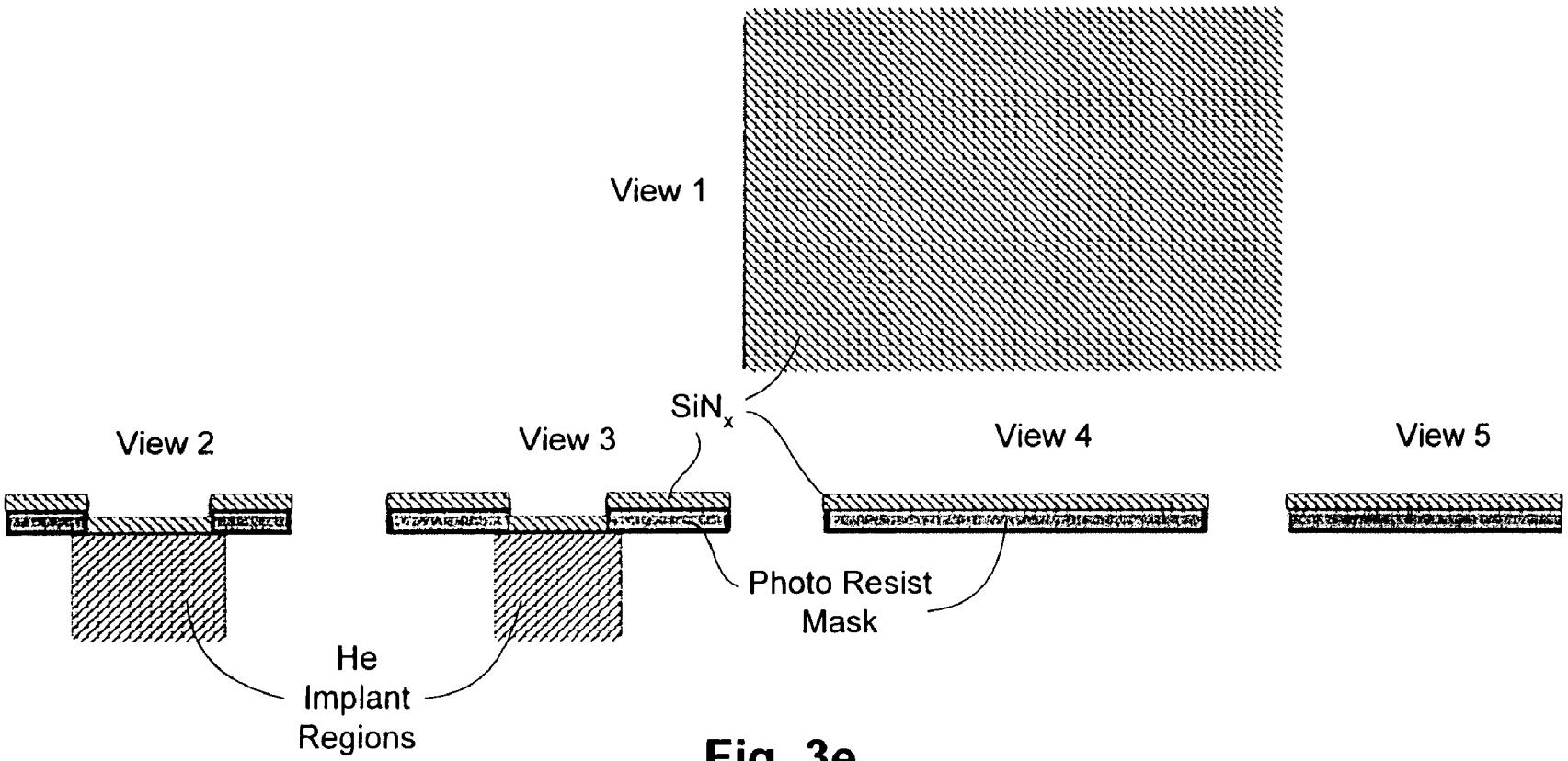

Step 5a: Perform deposition of high quality $SiN_x$ pad, 1000–2000 Å thick. This $SiN_x$ layer serves as the second electrical isolation for the collector and base contact pads. FIG. 3e shows the resulting structure after the $SiN_x$ deposition of this step. In one particular embodiment, 1000 Å of high quality $SiN_x$ pads were deposited on top of the He-implant region via plasma enhanced chemical vapor deposition (PECVD).

Figure 3F:
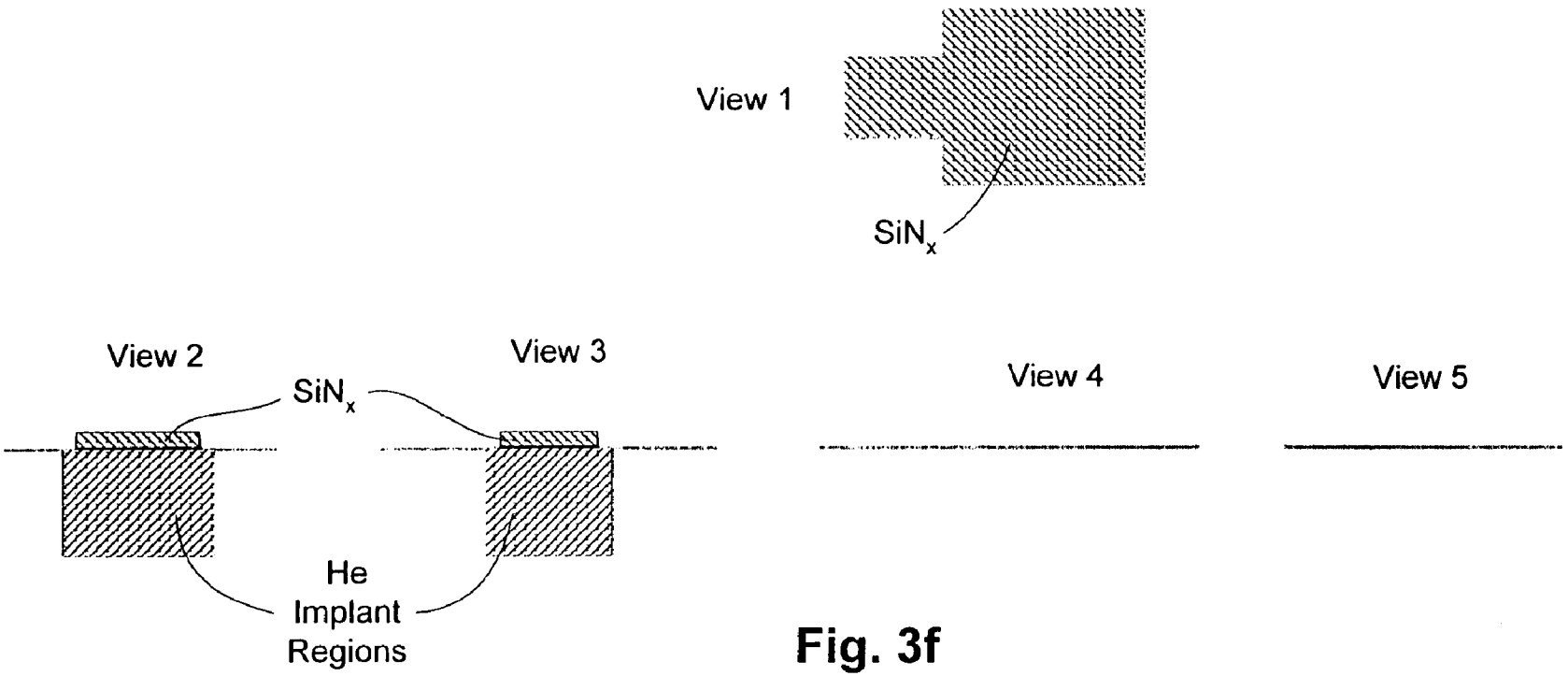

Step 5b: Perform lift-off of high quality silicon nitride pad, 1000–2000 Å thick. FIG. 3f shows the resulting structure after the $SiN_x$ lift-off of this step, where all $SiN_x$ deposited on top of photo resist is removed.

Figure 3G:
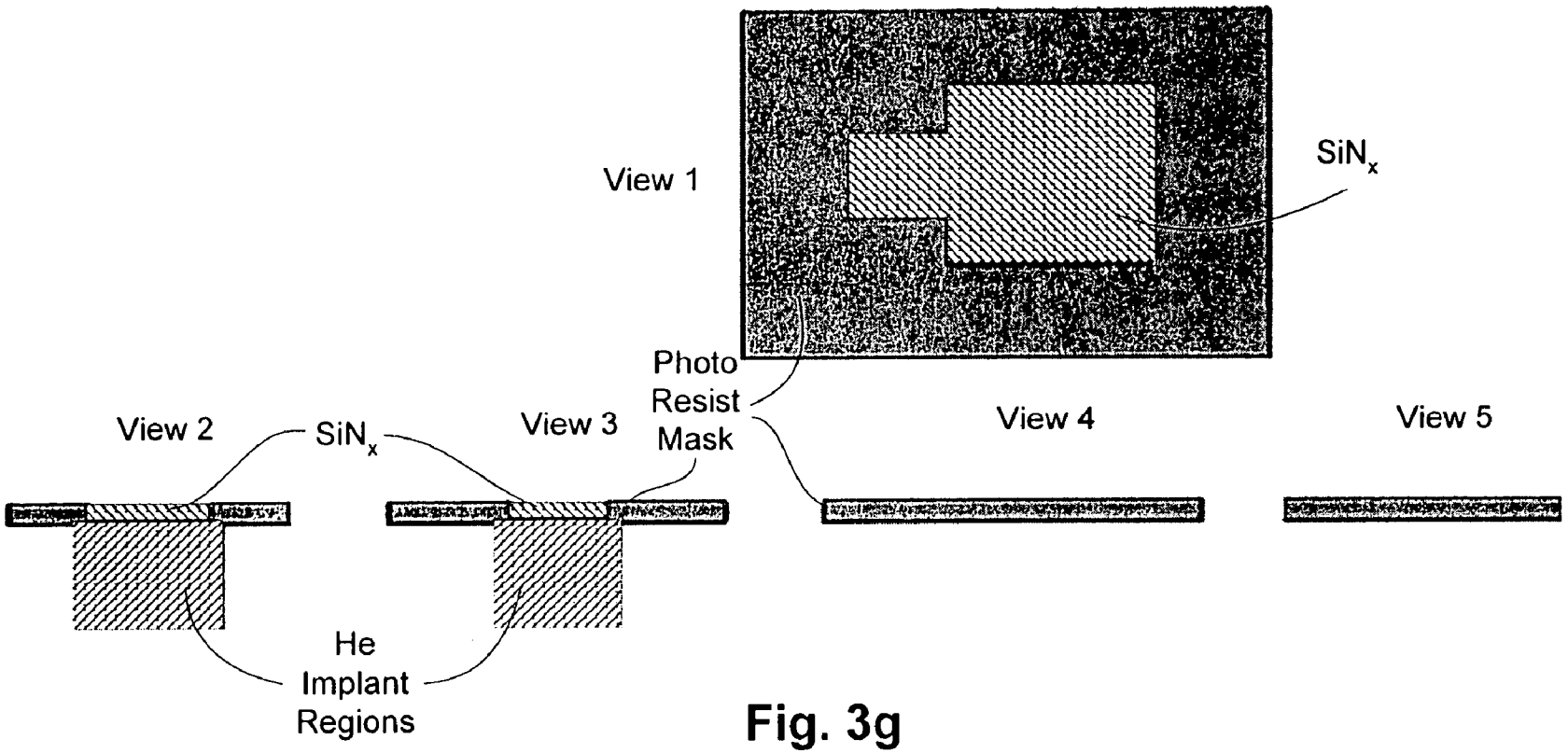

Step 6: Open windows for Ti metal pad using optical lithography. FIG. 3g shows the optical lithography for the Ti pad of this step.

Figure 3H:
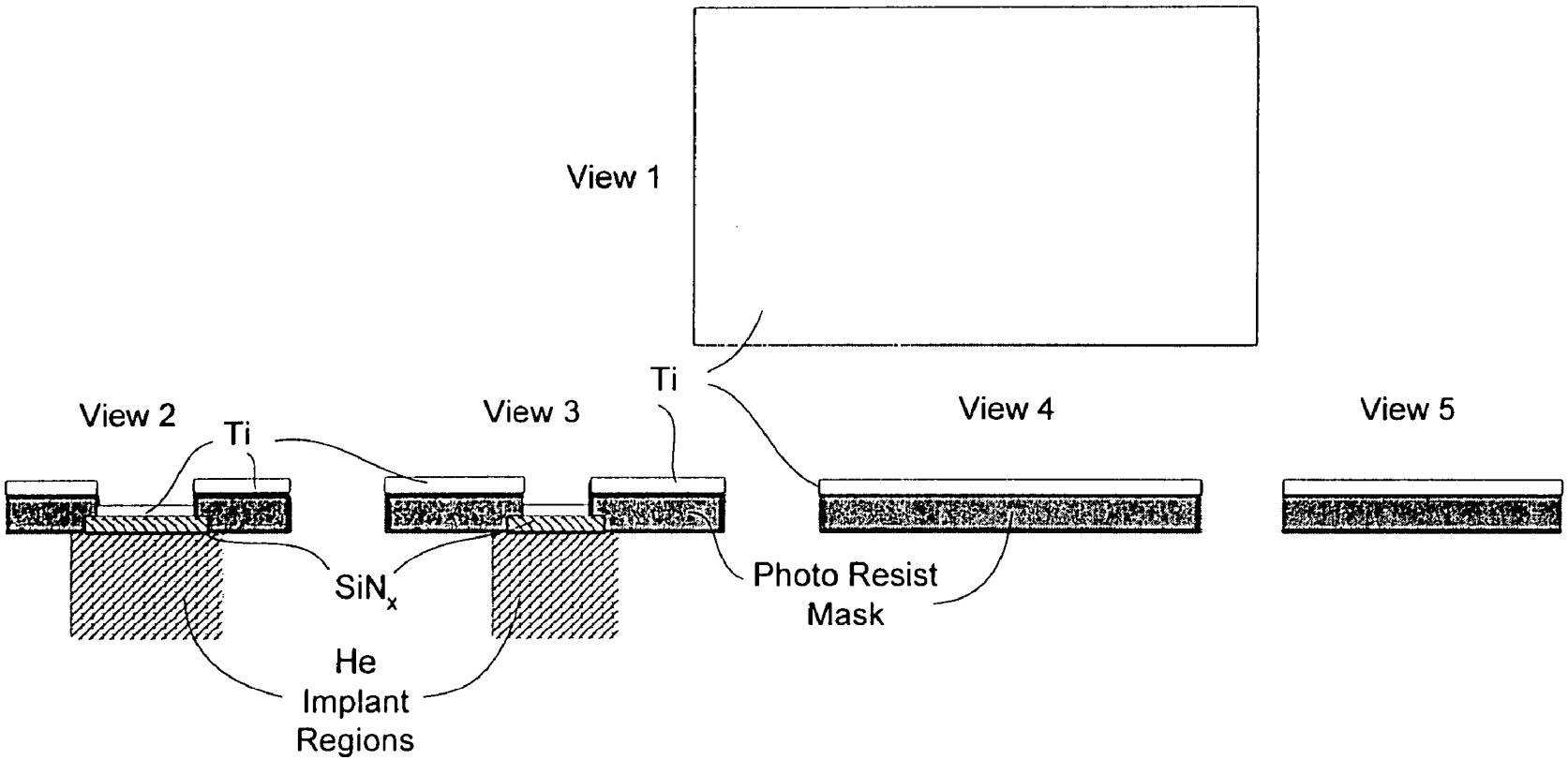

Step 6a: Perform Ti metallization. FIG. 3h shows the resulting structure after the Ti metallization of this step. In one particular embodiment, Ti/Au (500 Å/1000 Å) collector metal pads are deposited using e-beam evaporation.

Figure 3I:
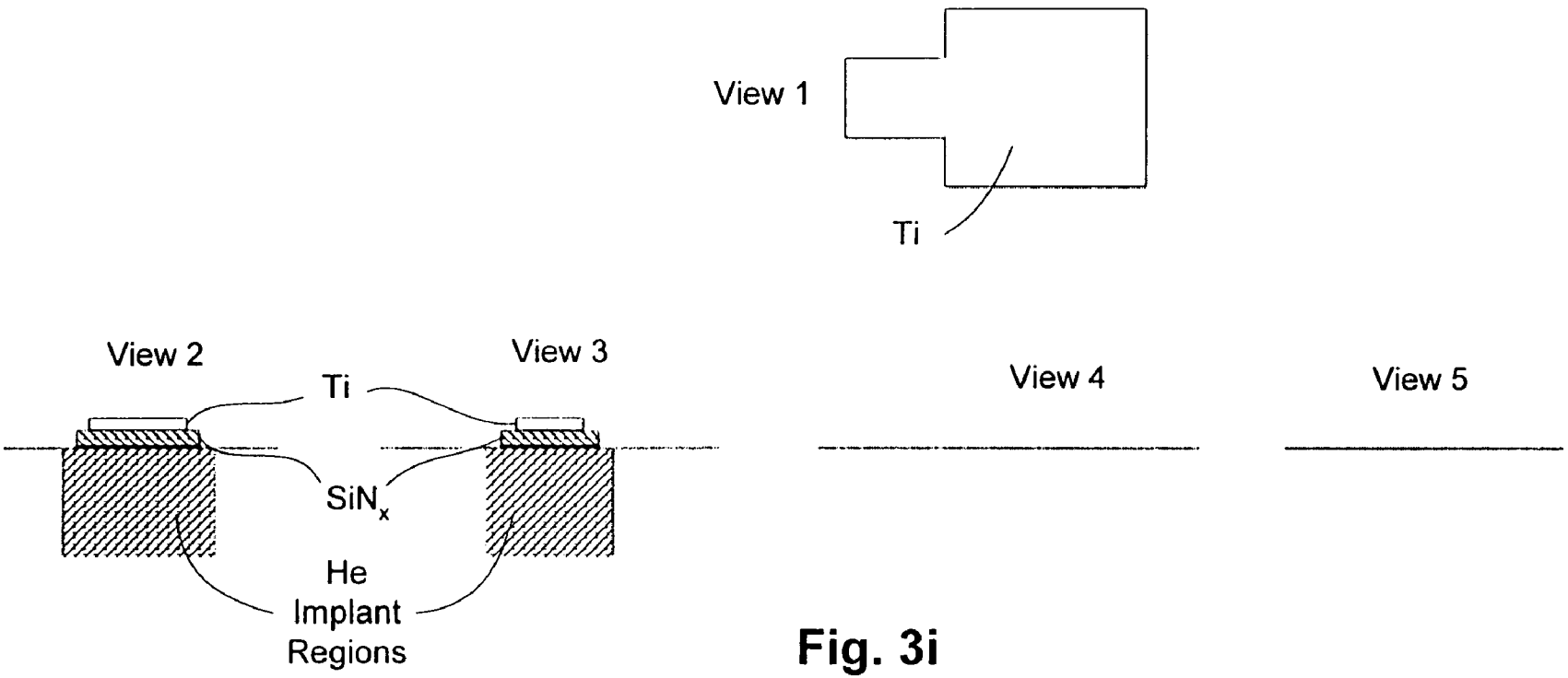

Step 6b: Perform lift-off of Ti metallization. FIG. 3i shows the resulting structure after the Ti metallization lift-off of this step, where all Ti deposited on top of photo resist is removed.

Figure 3J:
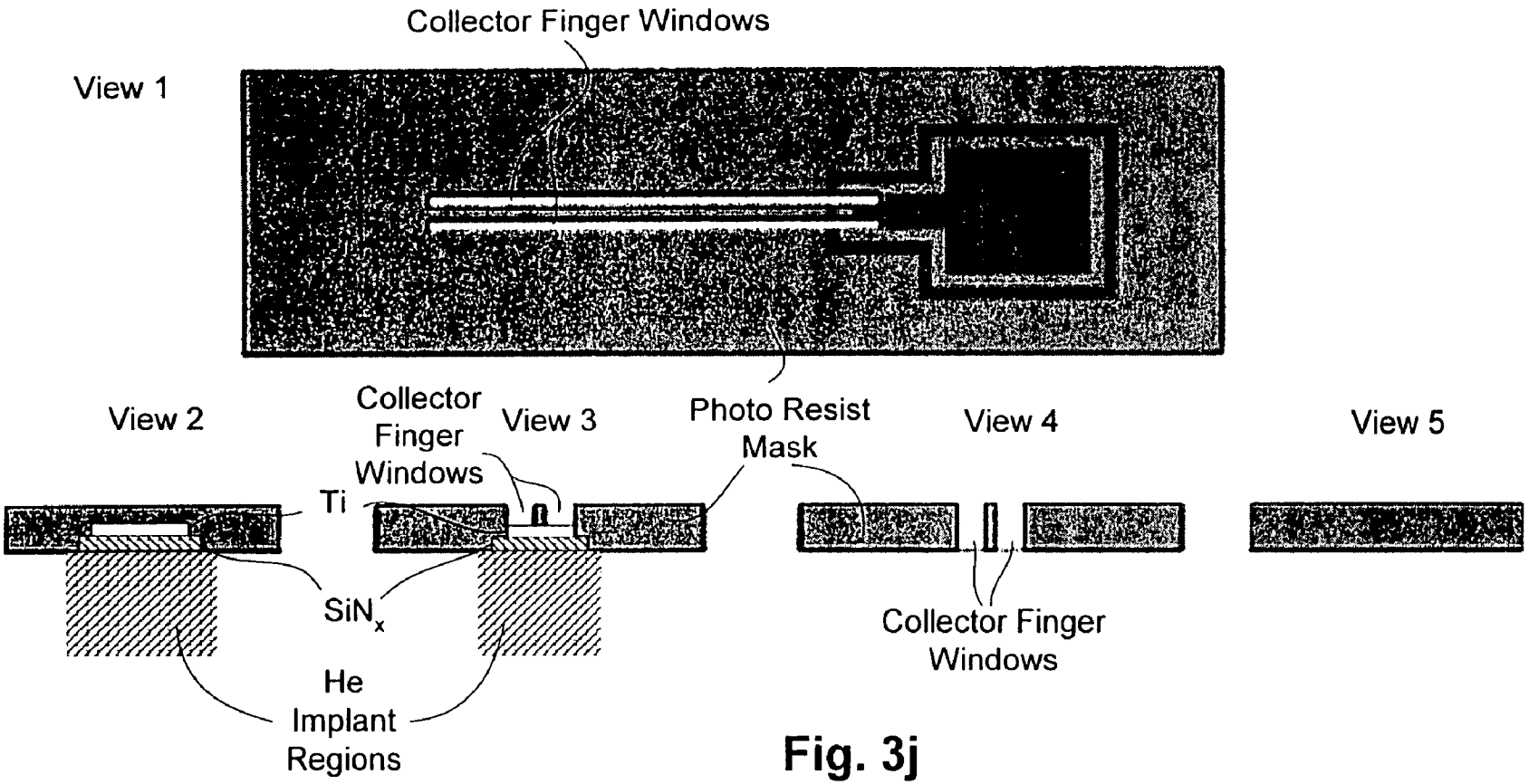

Step 7: Perform E-beam lithography of collector fingers and for self-aligned base recess and metallization. FIG. 3j shows the E-beam lithography of the collector fingers of this step. In one particular embodiment, the wafer is patterned with e-beam lithography using PMMA photo resist (about 0.14 μm) for the metallization of the collector fingers.

Figure 3K:
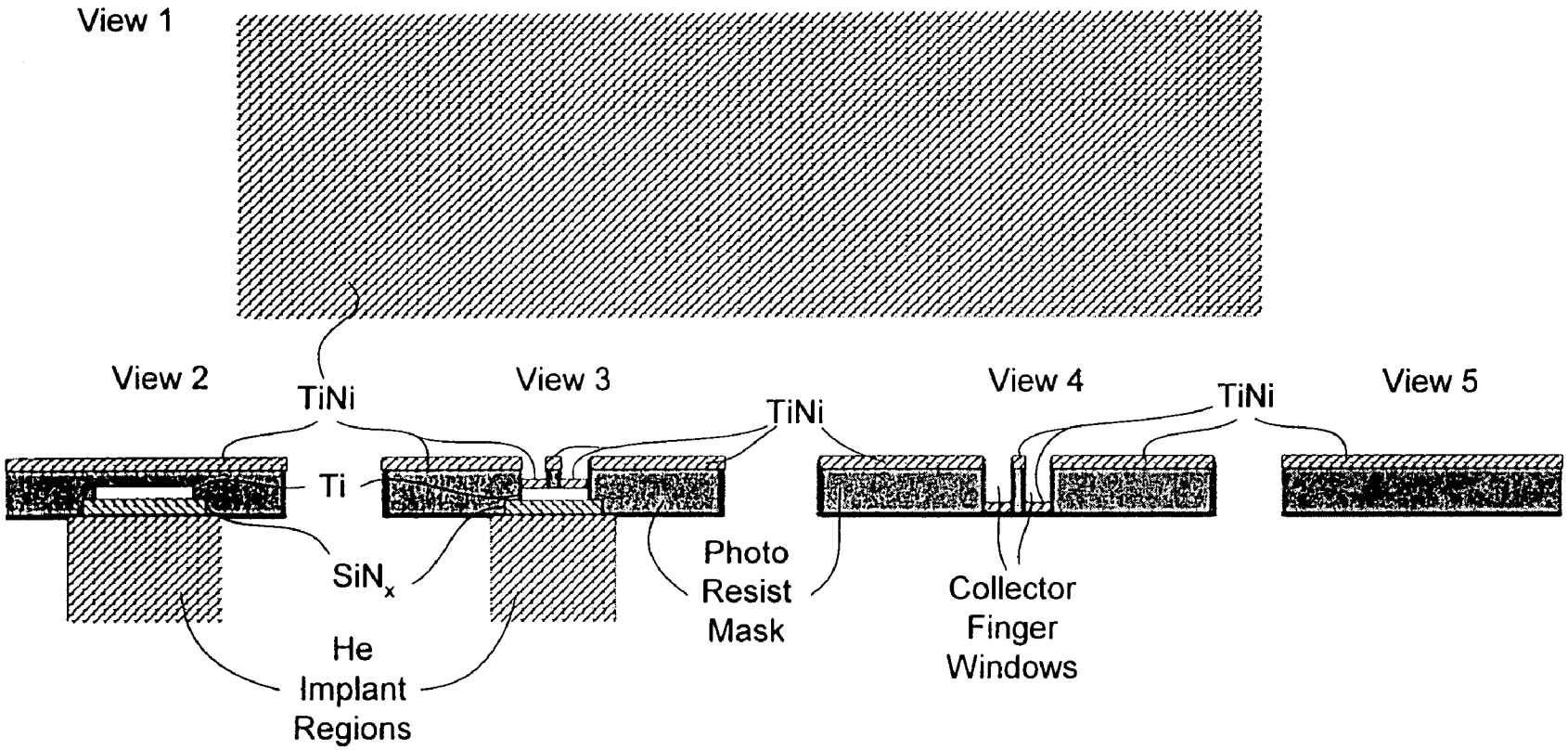

Step 7a: Perform ohmic metallization of collector. Prior to metallization, a 1 minute HCl:DI $H_20$ (1:1) dip is used for removing contaminants on the semiconductor surface. Although not mentioned in other steps, this can beneficially be used for all metal depositions on semiconductor material. FIG. 3k shows the resulting structure after the Ti/Ni metallization of this step. In one particular embodiment, the metal scheme used for the collector fingers is Ti/Ni with thicknesses of 100 Å and 400 Å, respectively. With this arrangement, Ti acts as the metal contact, while Ni serves as the base shallow etch mask.

Figure 3M:
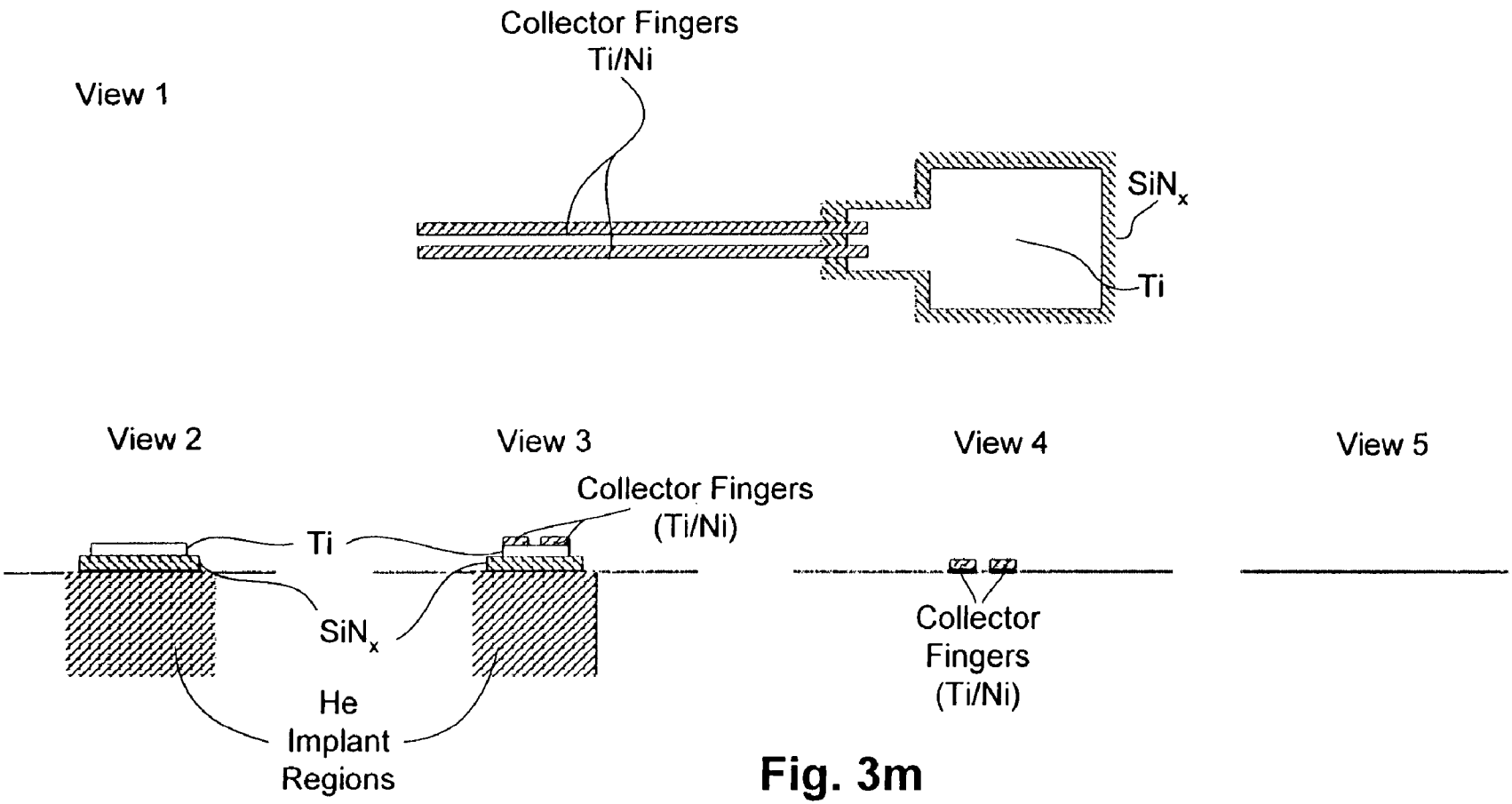

Step 7b: Perform lift-off of ohmic metallization of collector. FIG. 3m shows the resulting structure after the Ti/Ni metallization lift-off of this step, where all Ti/Ni deposited on top of photo resist is removed. In one particular embodiment, each collector finger is about 0.2 μm wide and 230 μm in length. Since only 200 μm of this length covers each finger active region of the device, the total finger area is 40 $\mu m^2$. Each device has 20 fingers either with a 1:1 pitch (evenly spaced) or 1:3 pitch.

Figure 3N:
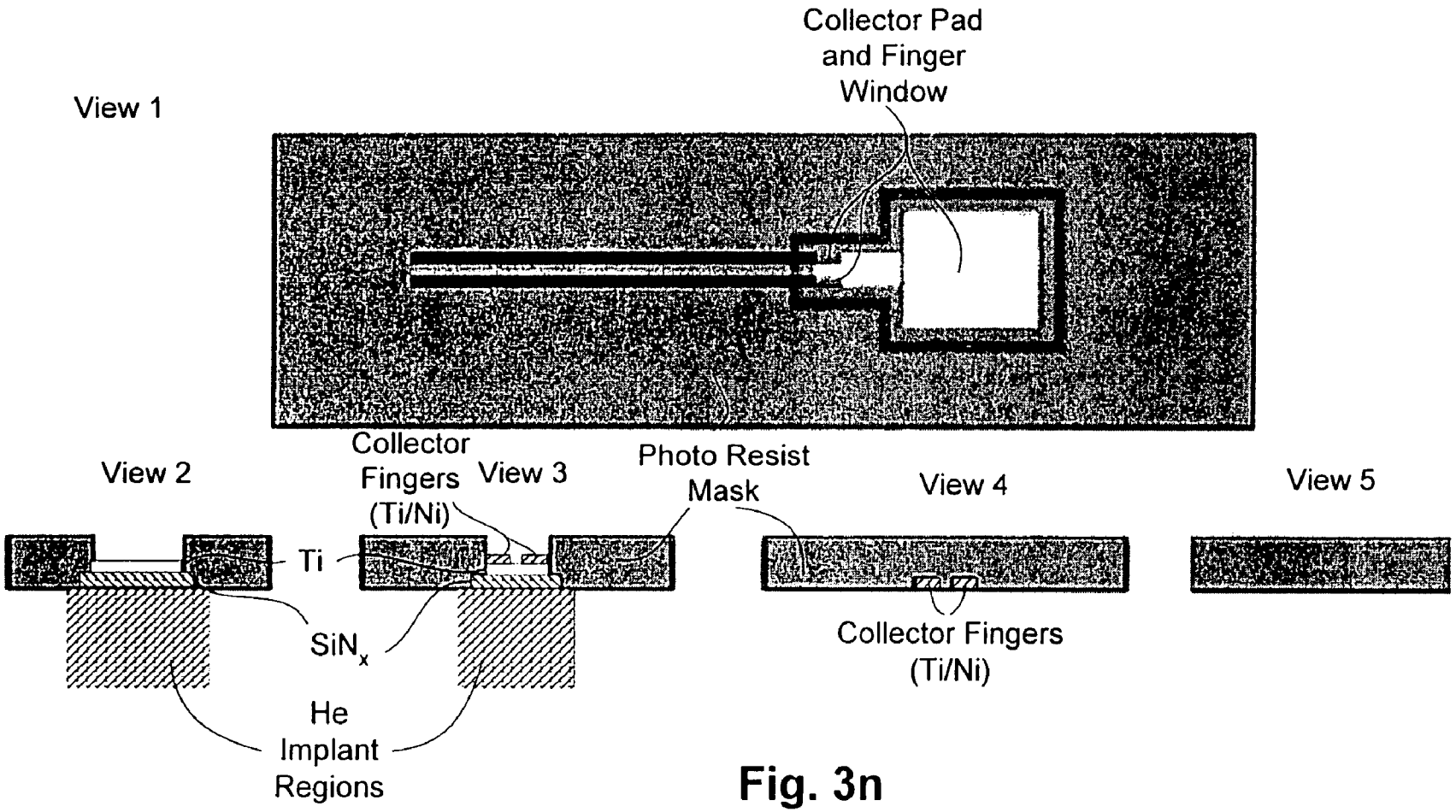

Step 8: Open windows for a Ti cap in collector pad region using optical lithography. FIG. 3n shows the optical lithography for the Ti cap of this step.

Figure 3P:
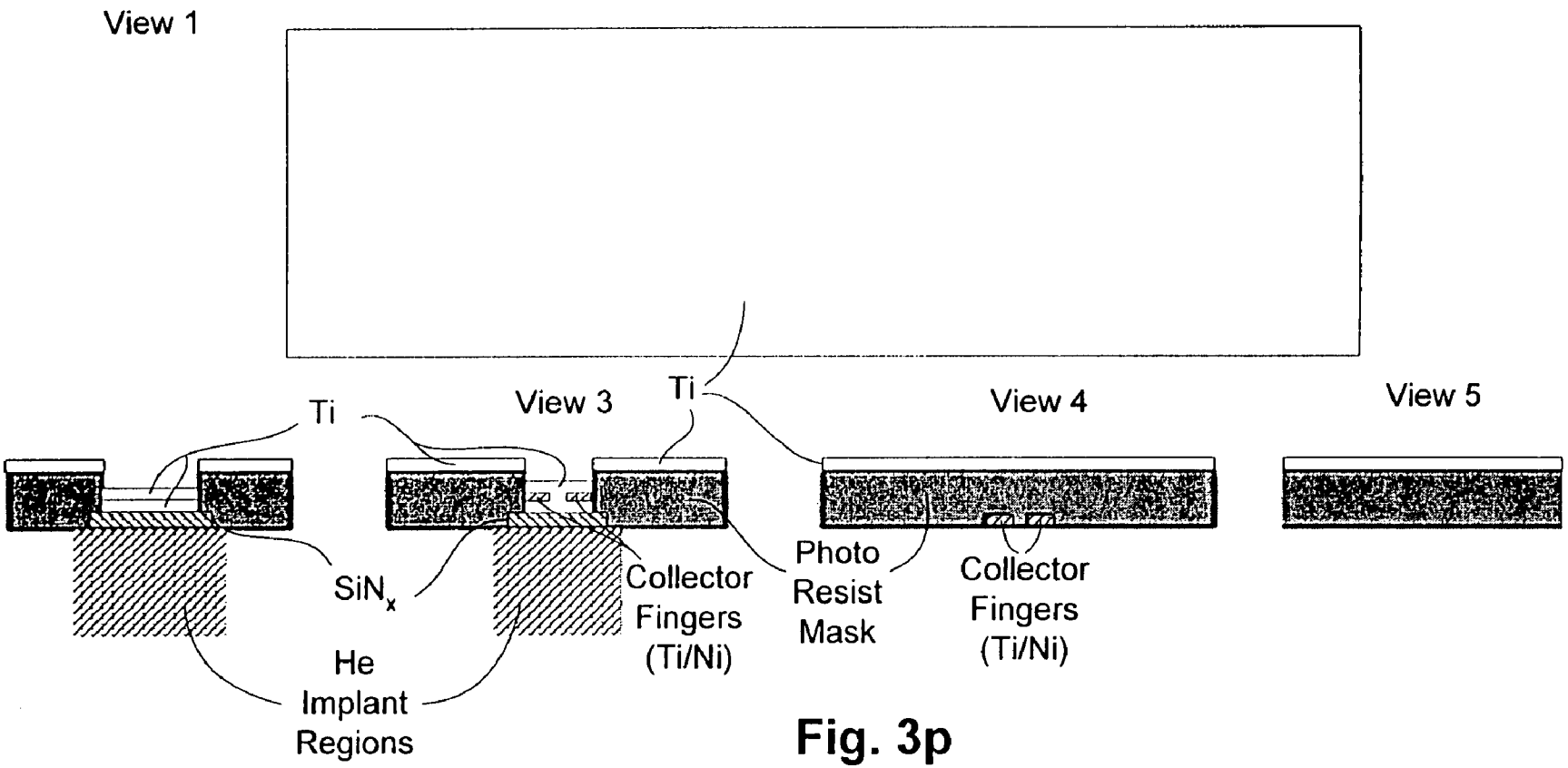

Step 8a: Deposit thin Ti cap in collector pad region again to prevent collector metal fingers from peeling upward and losing contact to the pad. FIG. 3p shows the resulting structure after the Ti metallization of this step. In one particular embodiment, Ti/Au (500 Å/1000 Å) collector metal caps are deposited using e-beam evaporation.

Figure 3Q:
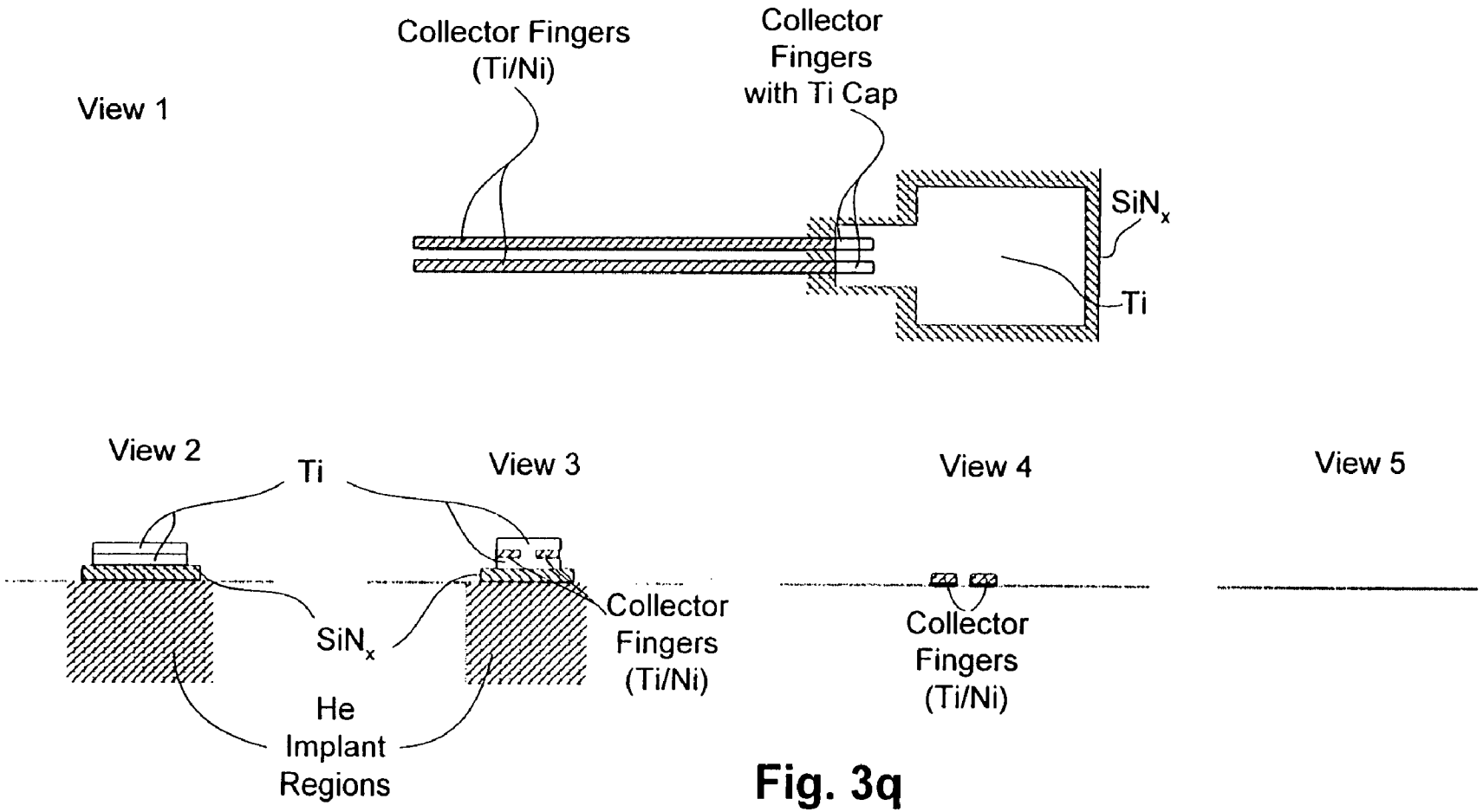

Step 8b: Perform lift-off of the thin Ti cap in collector region. FIG. 3q shows the resulting structure after the Ti metallization lift-off of this step, where all Ti deposited on top of photo resist is removed.

Figure 3R:
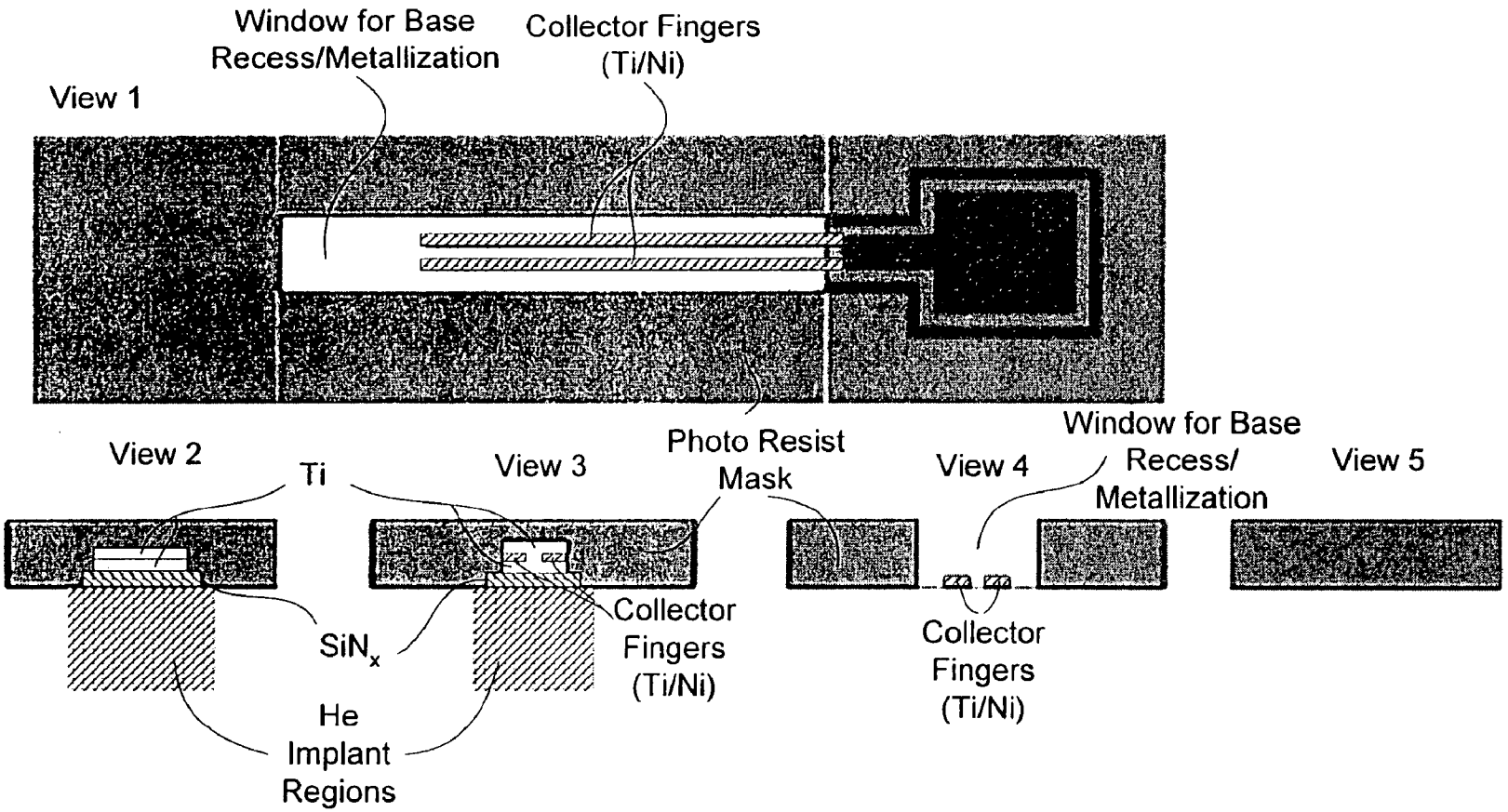

Step 9: Open windows for the base recess/metallization (collector lines are part of mask) using optical lithography. FIG. 3r shows the optical lithography for the base recess/metallization of this step.

Figure 3S:
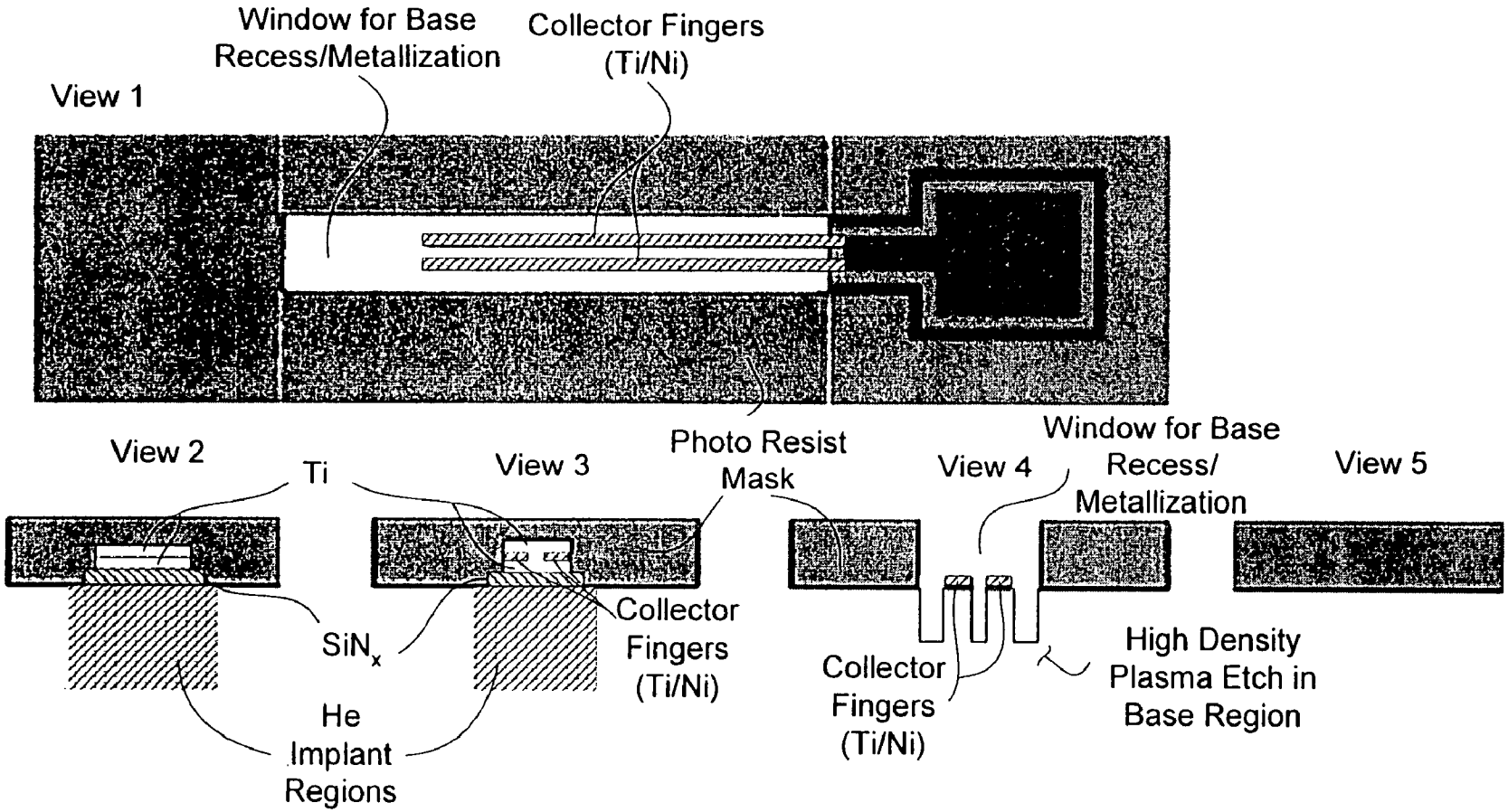

Step 9a: Perform a high density plasma etch to recess the base layer to $n^-$ layer (e.g., about 0.5 μm). FIG. 3s shows the resulting structure after the high density plasma etch in the base region of this step. In one particular embodiment, the wafer is etched using a custom-built inductively coupled plasma (ICP) etching system utilizing pure $Cl_2$ chemistry. Etching can be performed at a chamber pressure of about $3.8\times10^{-3}$ torr, 350 W ICP power and about −400 V chuck bias with a ramp down to about −200V bias for the last minute of the etch. The ramp down etches a layer of material damaged by plasma leaving behind undamaged GaN for subsequent metal contact deposition. This etch-damage removal enables excellent ohmic electrical characteristics. Approximately 0.5 nm etch depth is achievable.

Figure 3T:
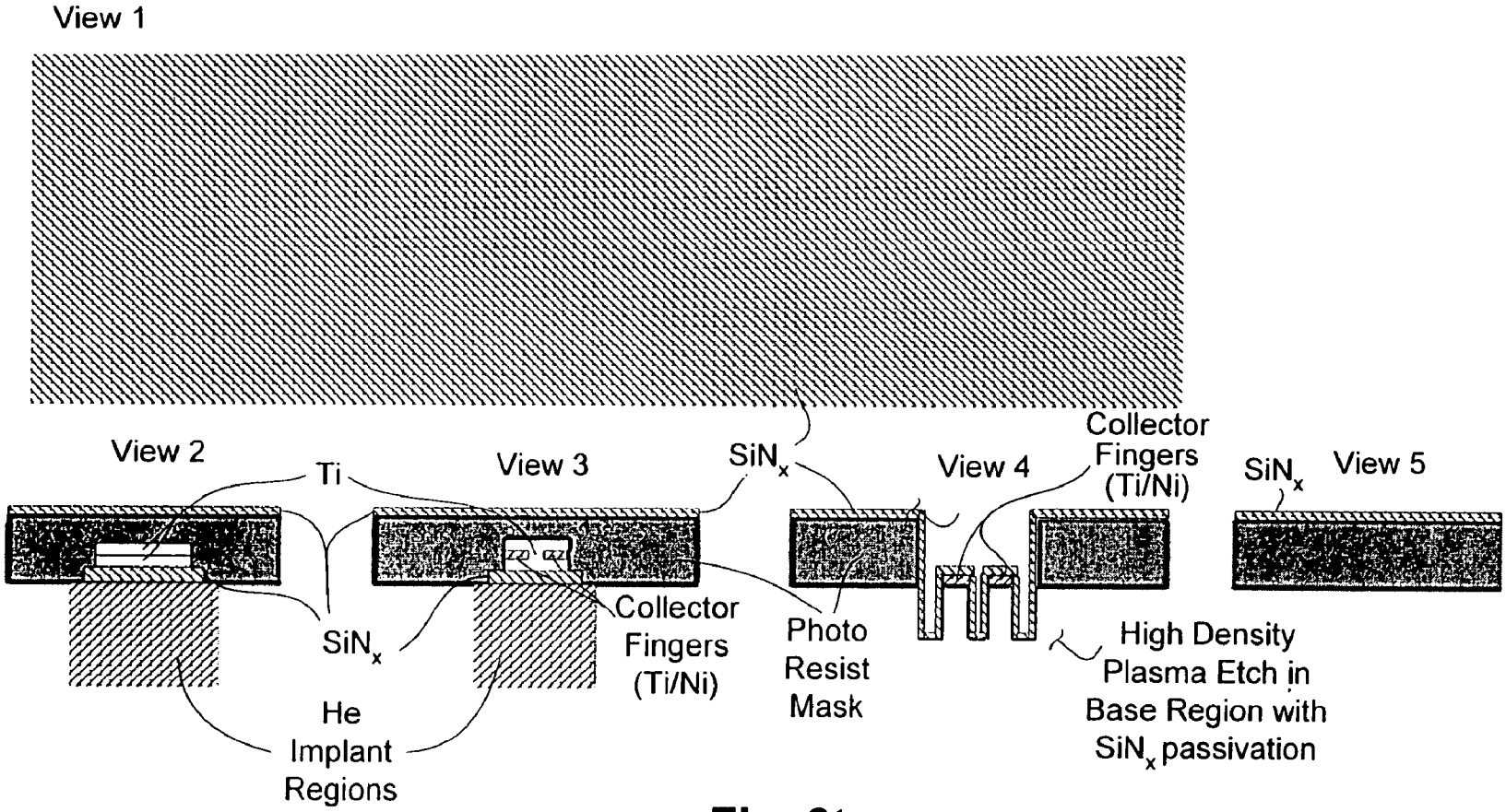

Step 9b: Perform conformal $SiN_x$ deposition for spacer and sidewall passivation. This layer prevents shorting between the base and collector if metal accidentally deposits on the finger sidewalls. FIG. 3t shows the resulting structure after the $SiN_x$ deposition for spacer and sidewall passivation of this step. In one particular embodiment, the conformal SiN layer is less than 500 Å.

Figure 3U:
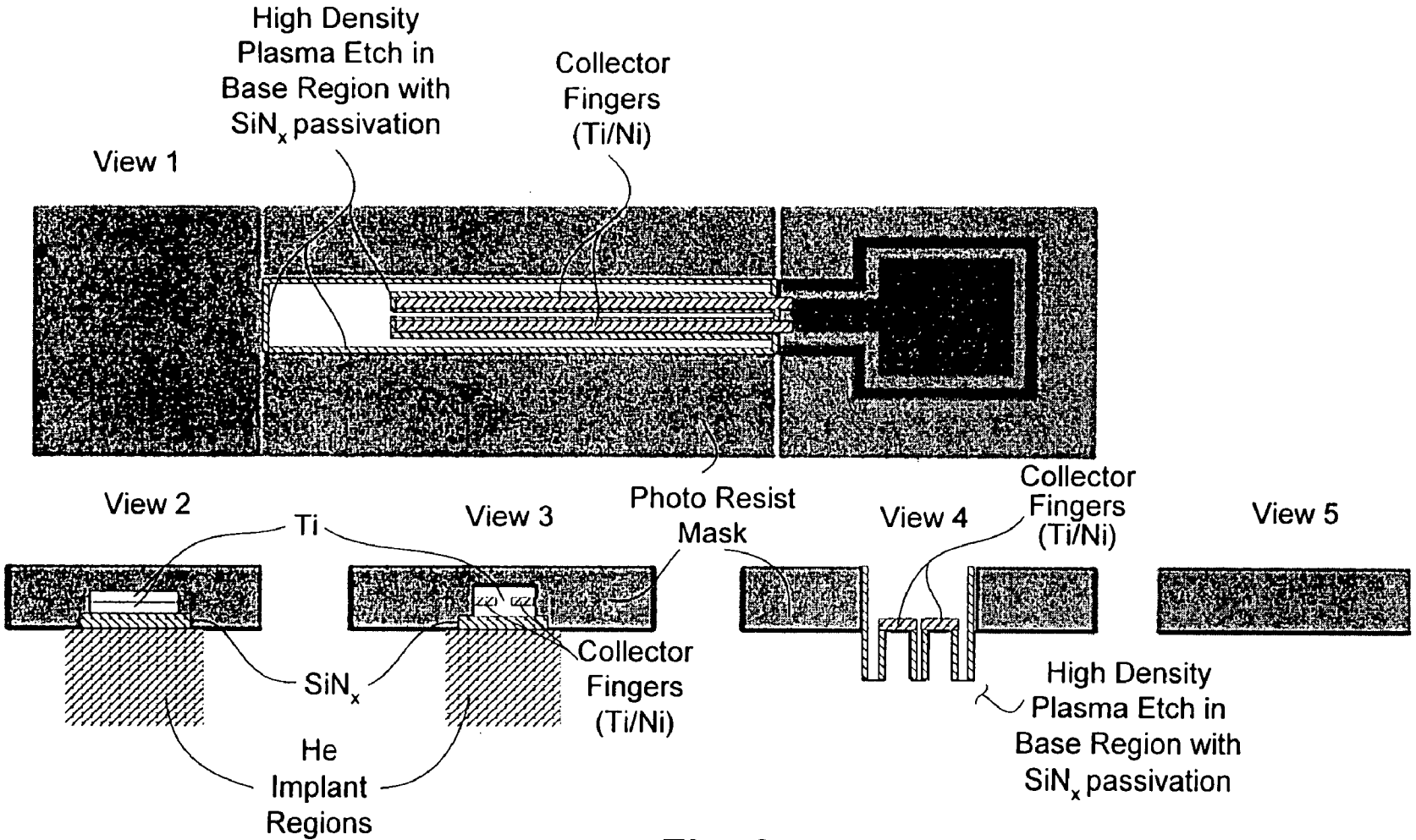

Step 9c: Perform directional etch to remove $SiN_x$ on parallel surfaces. FIG. 3u shows the resulting structure after the directional etch for $SiN_x$ removal of this step. In one particular embodiment, a directional reactive-ion etching (RIE) of the SiN planes parallel to the surface was used to expose the base layer between the fingers.

Figure 3V:
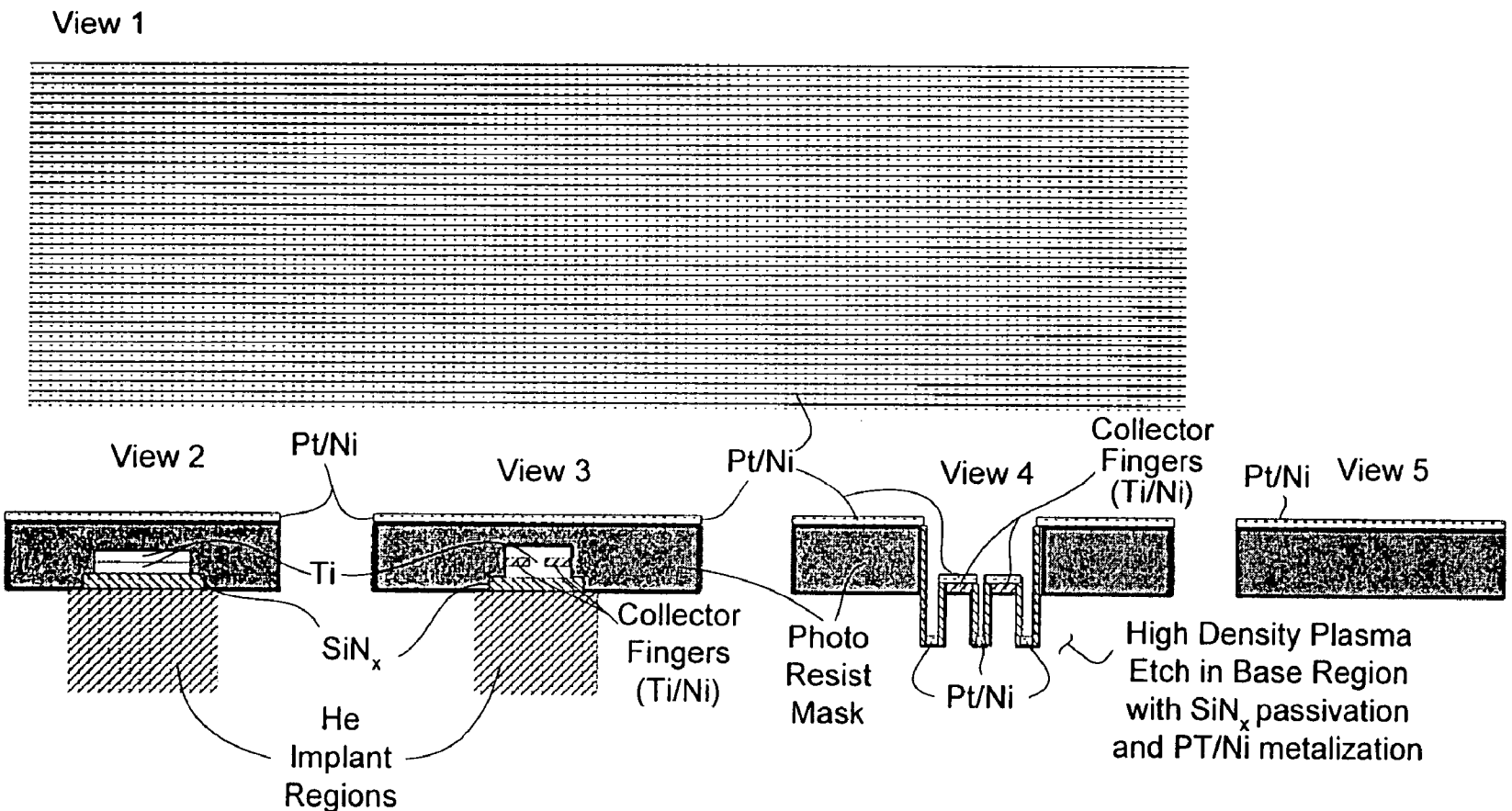

Step 9d: Perform base metallization (Pt/Ni). FIG. 3v shows the resulting structure after the base metallization of this step. In one particular embodiment, the base contact was deposited using Ni/Pt/Au (Schottky contacts) having layers of thickness 100 Å/400 Å/100 Å, respectively.

Figure 3W:
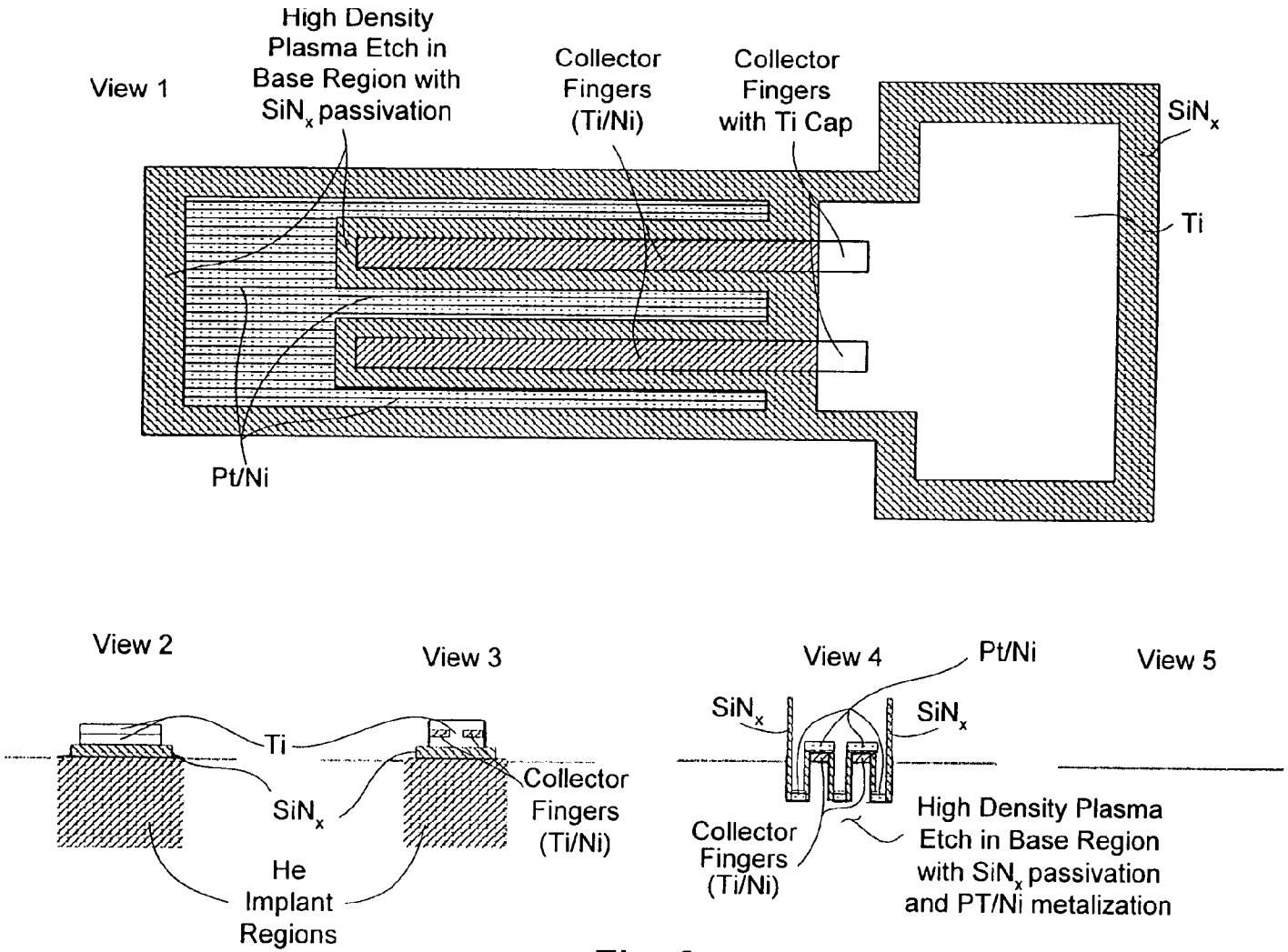

Step 9e: Perform lift-off of base metallization (Pt/Ni). FIG. 3w shows the resulting structure after the base metallization lift-off of this step.

Note that a post Schottky deposition anneal is used to alloy the ohmic contacts. This is because the Schottky metal is deposited before the emitter ohmic metal. A low temperature anneal does not substantially alter the forward bias behavior of the Schottky contacts, but decreases the reverse leakage current. Further note that the Schottky contacts are the contacts in the base region). In one particular embodiment, an anneal for about 60 seconds at 500° C. is used to maintain low reverse current leakage while providing low contact resistance.

Figure 3X:
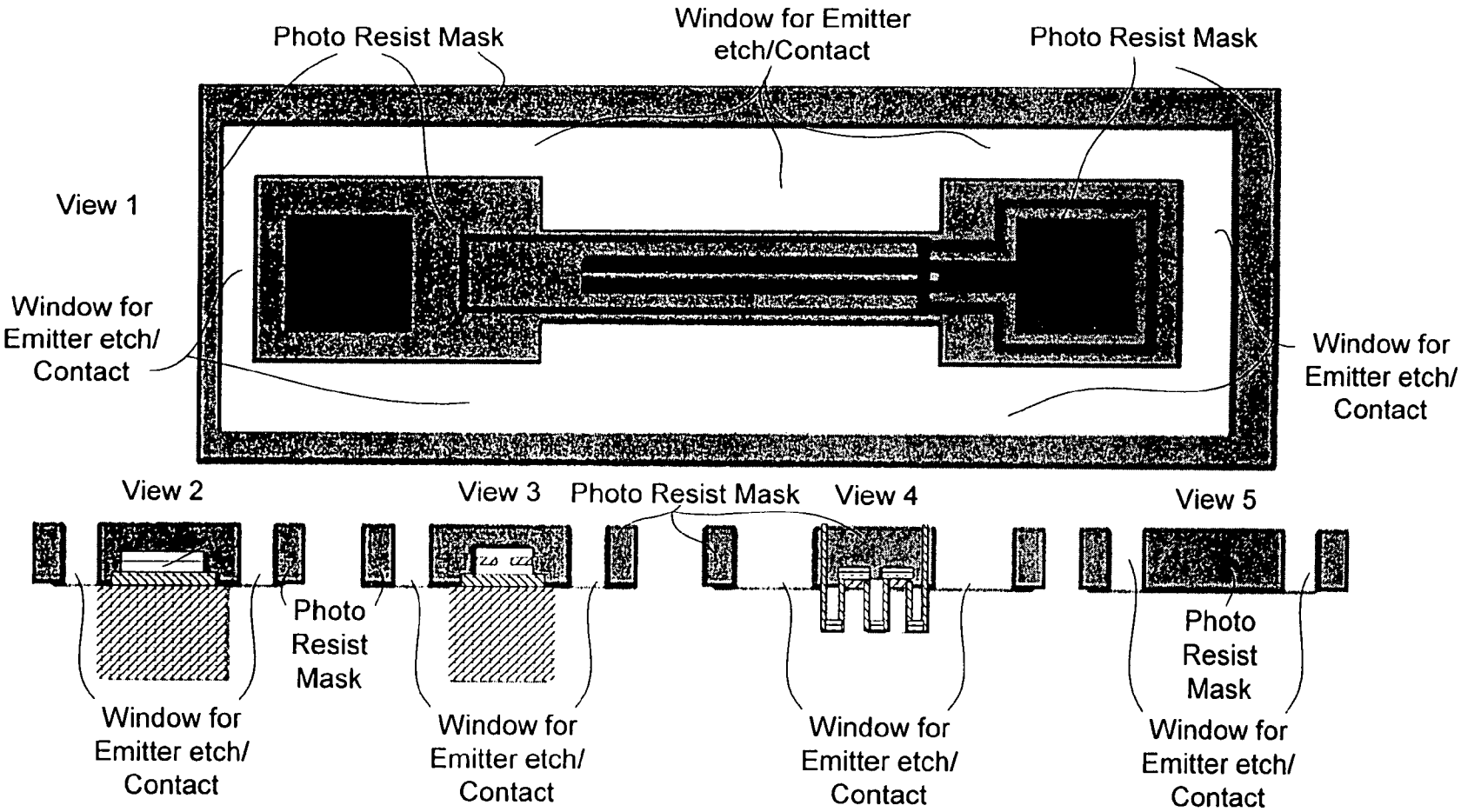

Step 10: Open emitter etch/contact window using optical lithography. FIG. 3x shows the resulting structure after the optical lithography for emitter etch of this step. In one particular embodiment, the wafer is patterned with a thick photoresist (e.g., about 4 μm) for a deep etch of 2 μm to 3 μm down to the emitter layer via ICP etching.

Figure 3Y:
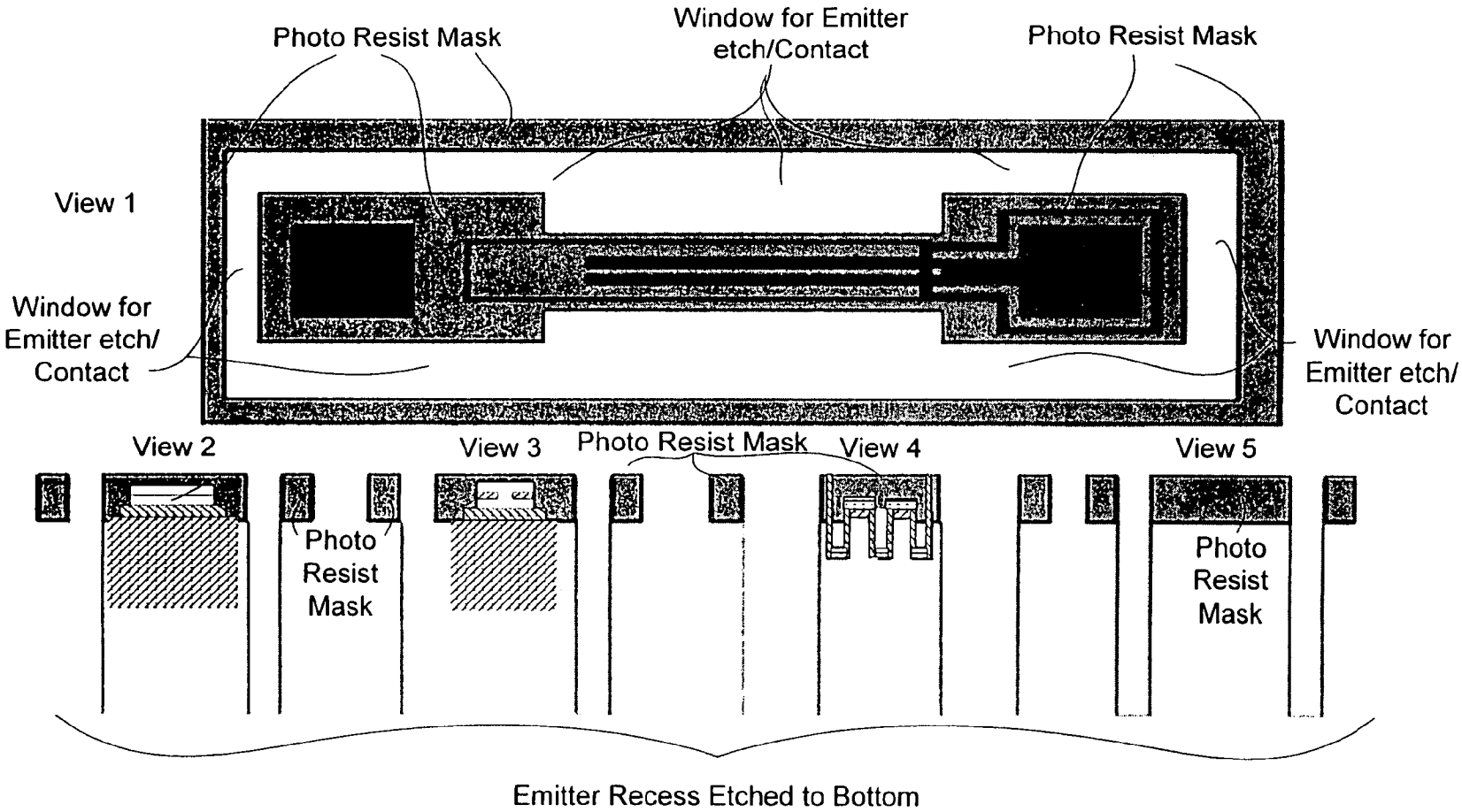

Step 10a: Etch emitter recess to bottom, HVPE $n^+$ GaN quasi-substrate layer (e.g., about 2.5 μm). FIG. 3y shows the resulting structure after the etching of the emitter recess of this step.

Figure 3Z:
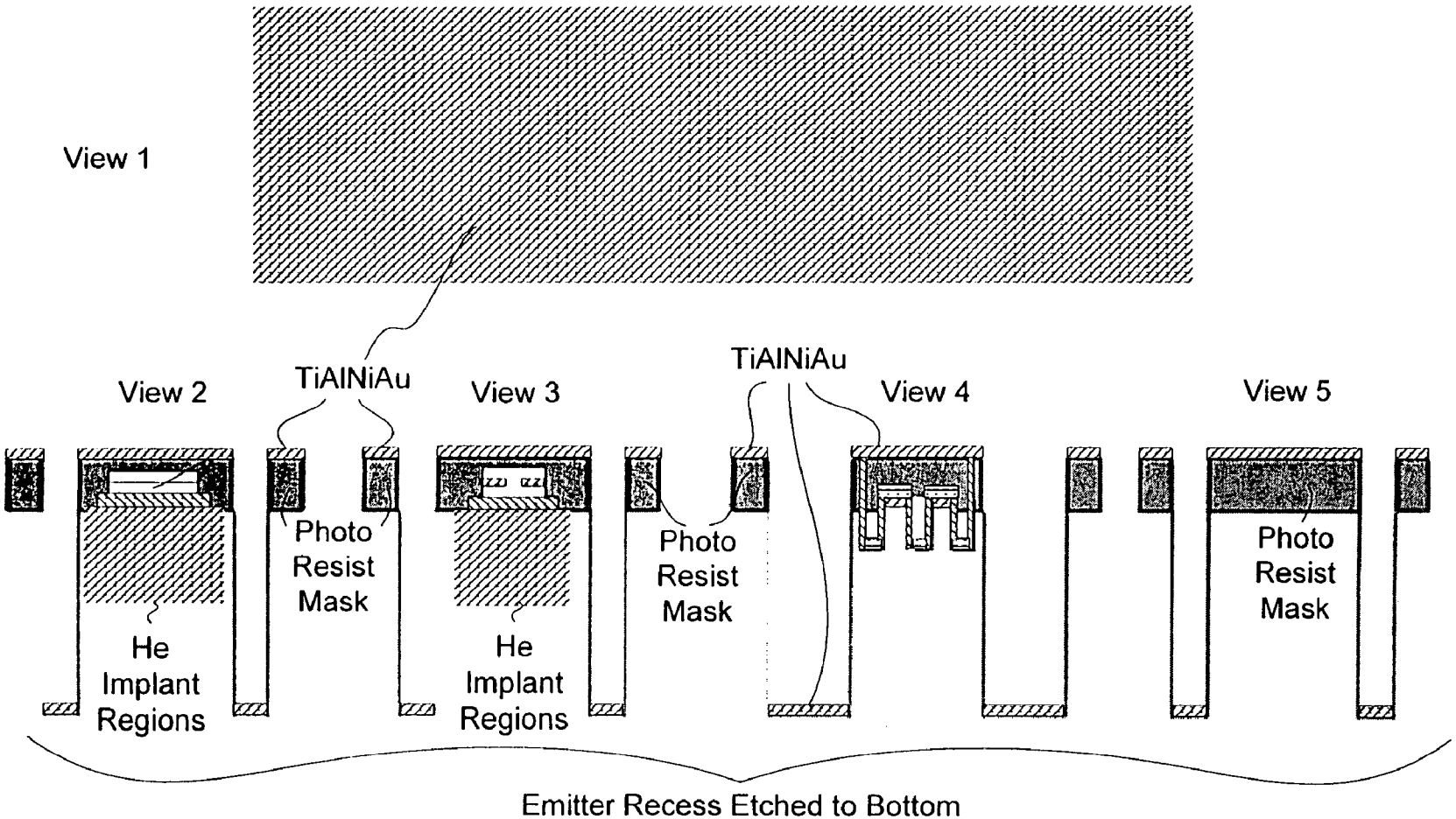
Figure 3A:
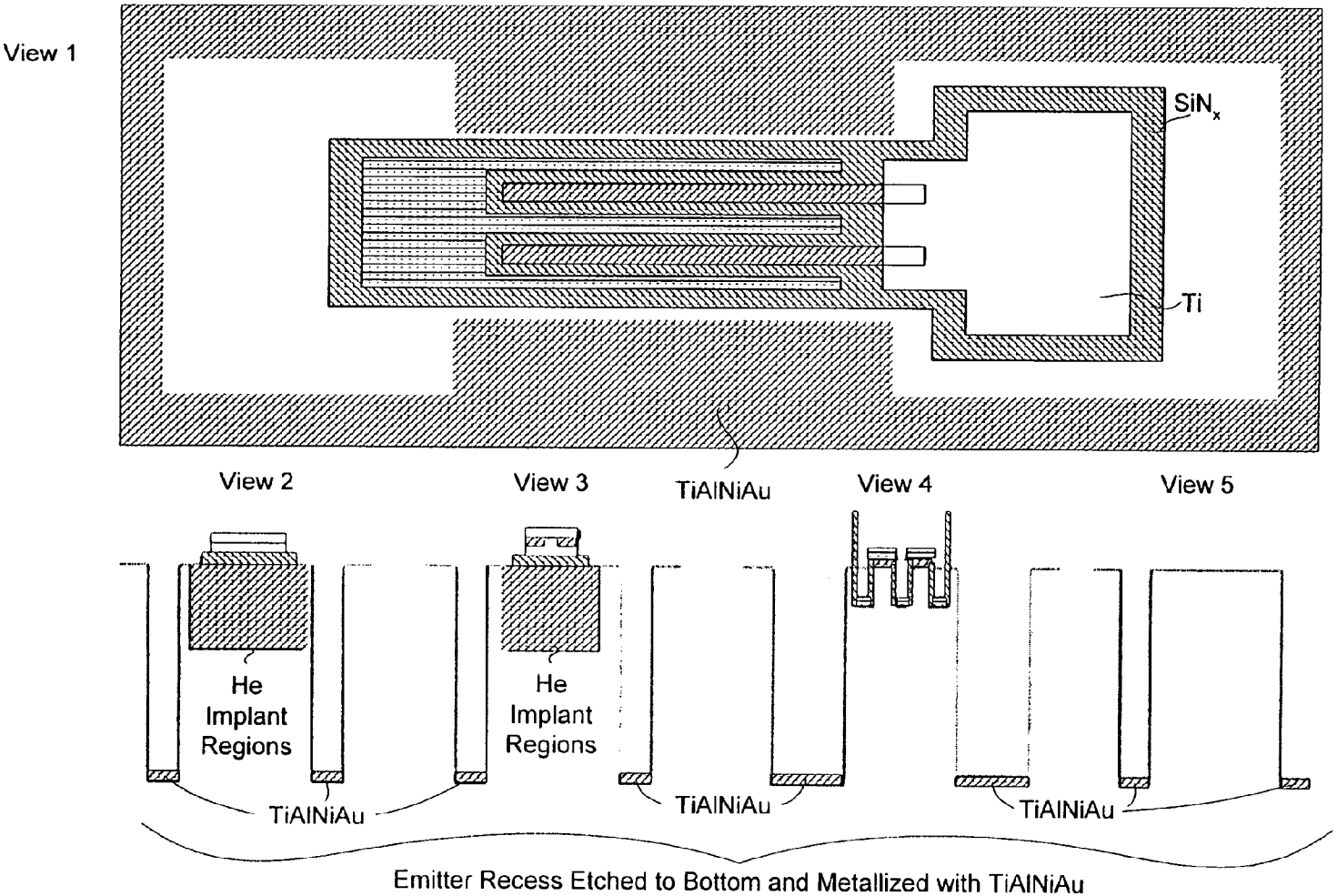
Figure 3B:
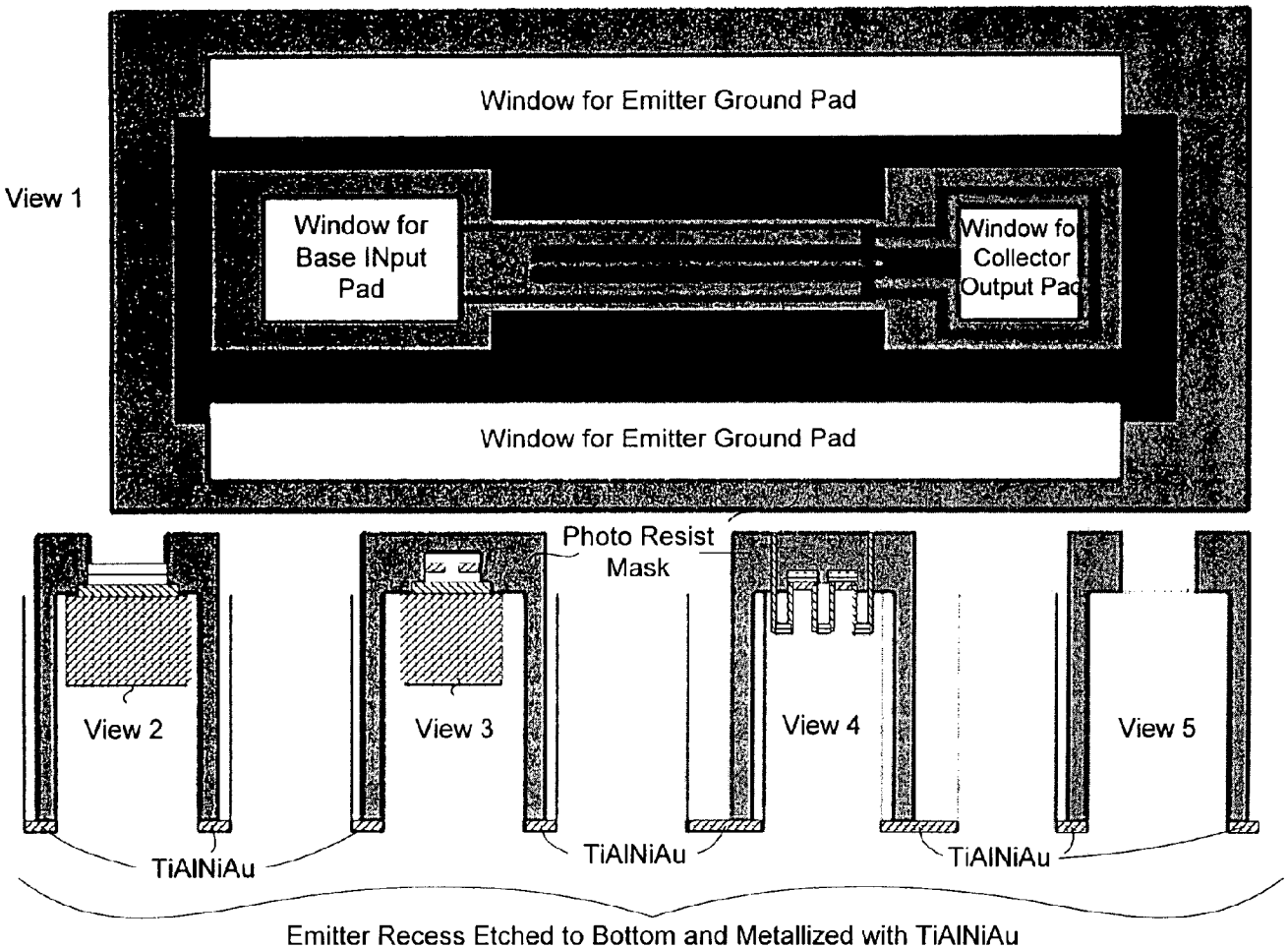
Figure 3C:
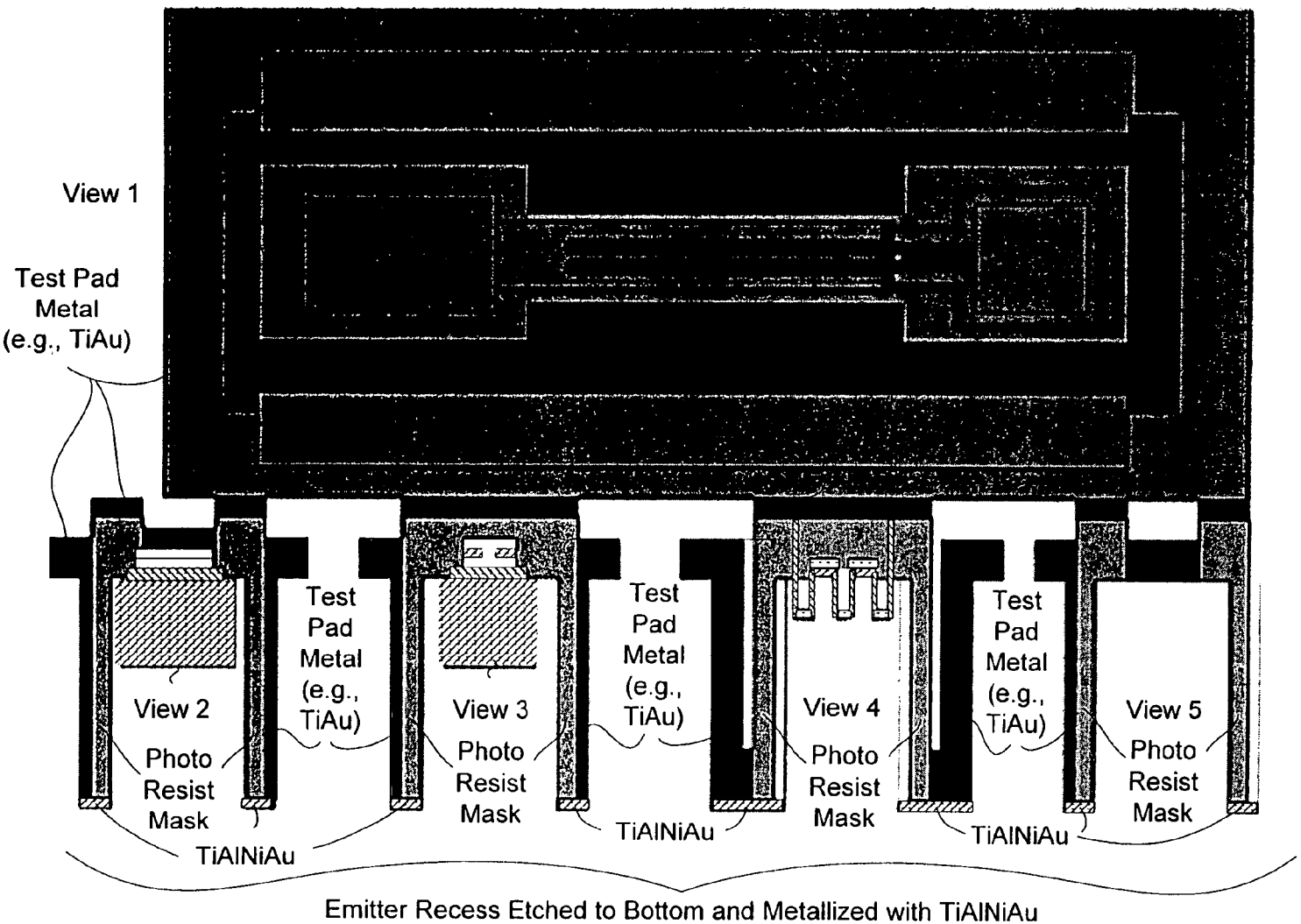
Figure 3D:
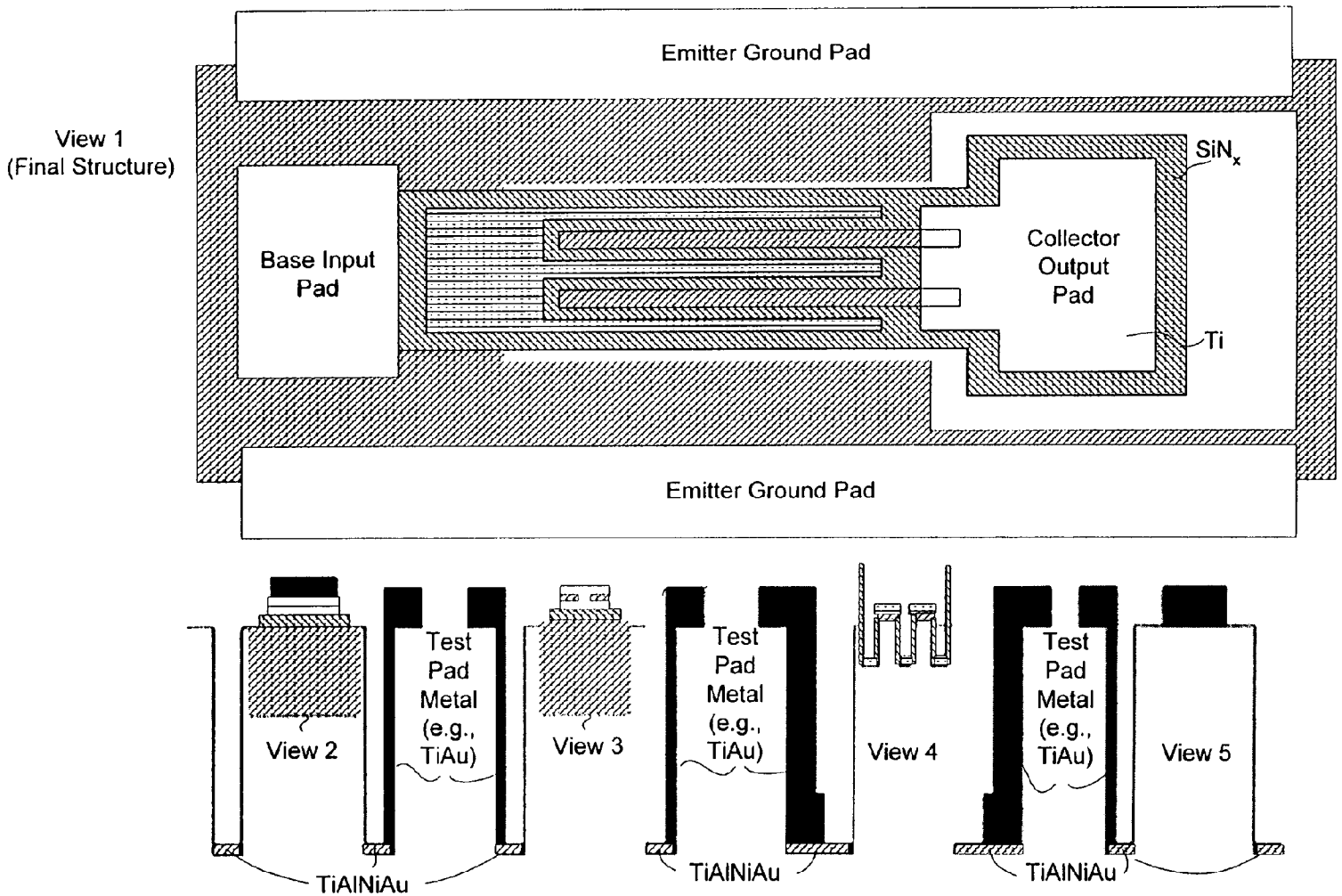

Step 10b: Perform emitter ohmic metallization. FIG. 3z shows the resulting structure after the emitter ohmic metallization of this step. In one particular embodiment, the emitter ohmic contacts were deposited using a Ti/Al/Ni/Au metal scheme having thicknesses of 300 Å/1500 Å/400 Å/1500 Å, respectively.

Step 10c: Perform lift-off of emitter ohmic metallization. FIG. 3aa shows the resulting structure after the emitter ohmic metallization of this step.

Step 11: Open windows for RF test pad metallization using optical lithography. FIG. 3bb shows the resulting structure after the optical lithography of this step.

Step 11a: Deposit RF test pad metal. FIG. 3cc shows the resulting structure after the deposition of test pad metal of this step. In one particular embodiment, this metal includes an adhesion layer (e.g., titanium or nickel) and a thick gold (Au) capping layer, since Au is a good microwave conductor and prevents oxidation.

Step 11b: Perform lift-off RF test pad metal. FIG. 3dd shows the resulting and final structure after the RF test pads liftoff of this step.

Variations on Fabrication Methodology

A first variation on the PBT fabrication methodology deals with the deposition of the $SiN_x$ in step 5. In more detail, a conformal deposition of $SiN_x$ over the entire wafer followed by photo resist patterning and wet chemistry etch to remove the $SiN_x$ from the unwanted areas may be more desirable, since $SiN_x$ is sometimes difficult to remove via liftoff. In this case, the $SiN_x$ is about 1000 Å thick, and the wet chemical etch will provide a shallow slope on the sidewalls which will ensure metal continuity from the collector fingers to the contact pad. In addition, the metal pad on top of the collector region can be altered to Ni/Pt because of the new Schottky metal on the collector fingers.

Figure 4:
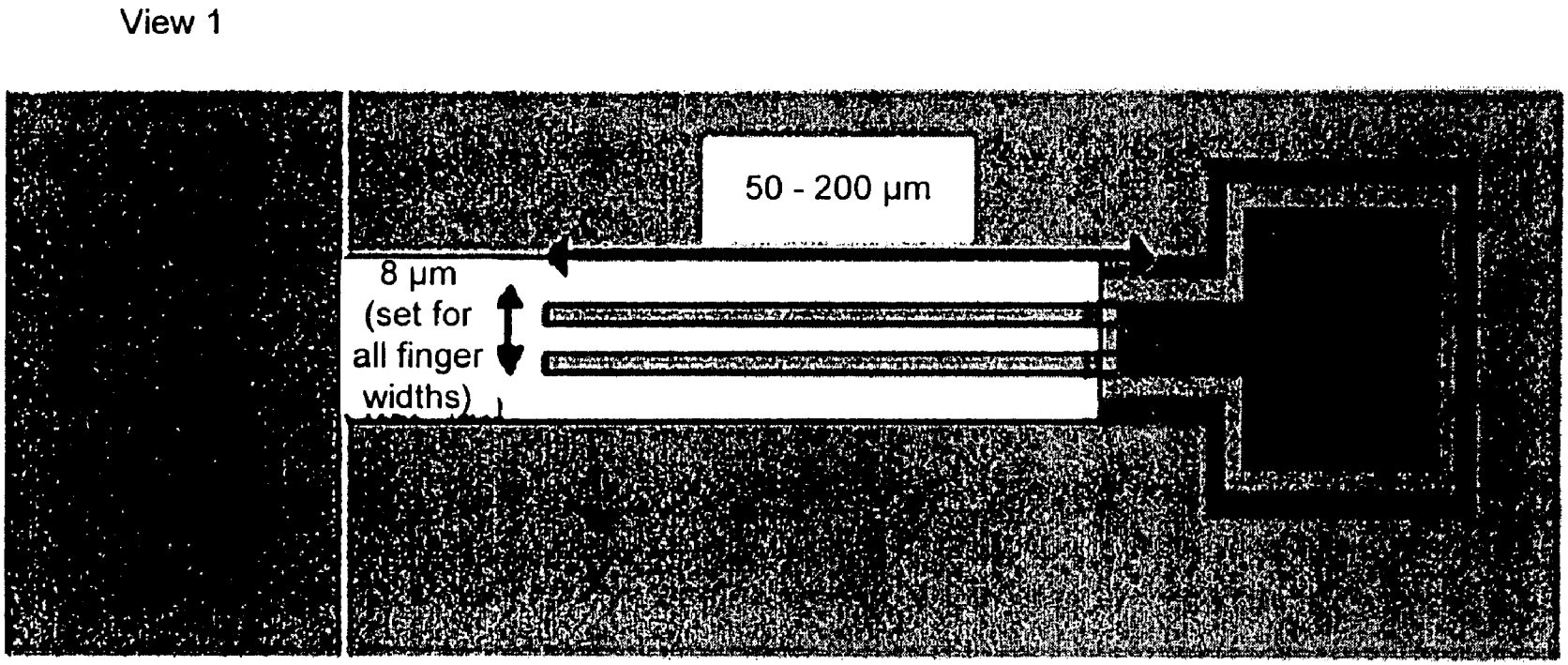

The electron beam lithography can also be changed, to provide a second variation. In particular, instead of opening up windows for the fingers and depositing metal as previously described in steps 7 through 7b, a large window can be opened. For example, FIG. 4 shows the e-beam lithography for opening a large base window in accordance with one such embodiment of the present invention. This window would be used for base recess and metallization as well as collector finger metallization. This will ensure that the metal on the collector fingers is not very thick, thus minimizing the chance of connection between the various fingers.

Following base recess, all steps would be similar to those previously discussed until step 9d, where the Schottky metal deposited would be the metal for both the base region and collector fingers. The Schottky metal would be feasible as the collector metal because of ballistic electrons that could pass the potential barrier. In addition, the Ti capping layer on the collector contact in steps 8 through 8b can be omitted, in this particular variation.

In a third variation of the fabrication process, a "0" level Ti/Pt layer can be used. In more detail, note that the first layer (step 3) is a He implantation, which requires alignment for further steps in the process. In particular, implanted He areas are not distinguishable under optical alignment For this reason, a "0" level mask for subsequent optical and electron beam alignment was added. The metal to be used for enabling optical alignment is titanium (Ti) followed by platinum (Pt). In one such embodiment, this "0" level mask is a Ti/Pt layer of about 200–500/1500 Å, respectively. These metals are chosen because of Ti's good adhesion to GaN and Pt is a good alignment metal for e-beam writers (because it is high Z). Crosses for optical alignment and squares for e-beam alignment are thus provided.

The thick Pt was found to work best for this e-beam writing system. Also, it was found that the $He^{2+}$ implantation given in step 3 would penetrate the photo resist about 3.50 μm based on a TRIM calculation of Rp+ΔRp (the ion range and range straggling). This shows that a thick resist, such as AZ4620, is needed. In addition, the $SiN_x$ etch can be done via a wet chemistry of $NH_4F$, which will leave a shallow slope on the nitride walls due to the slow etching and isotropy characteristic of wet chemistry etches. The e-beam photo resist, PMMA, is not intended to be a dry etch mask and for this reason, cannot be used as previously given in step 7. For this reason, only the collector fingers shall be opened.

Figure 5A:
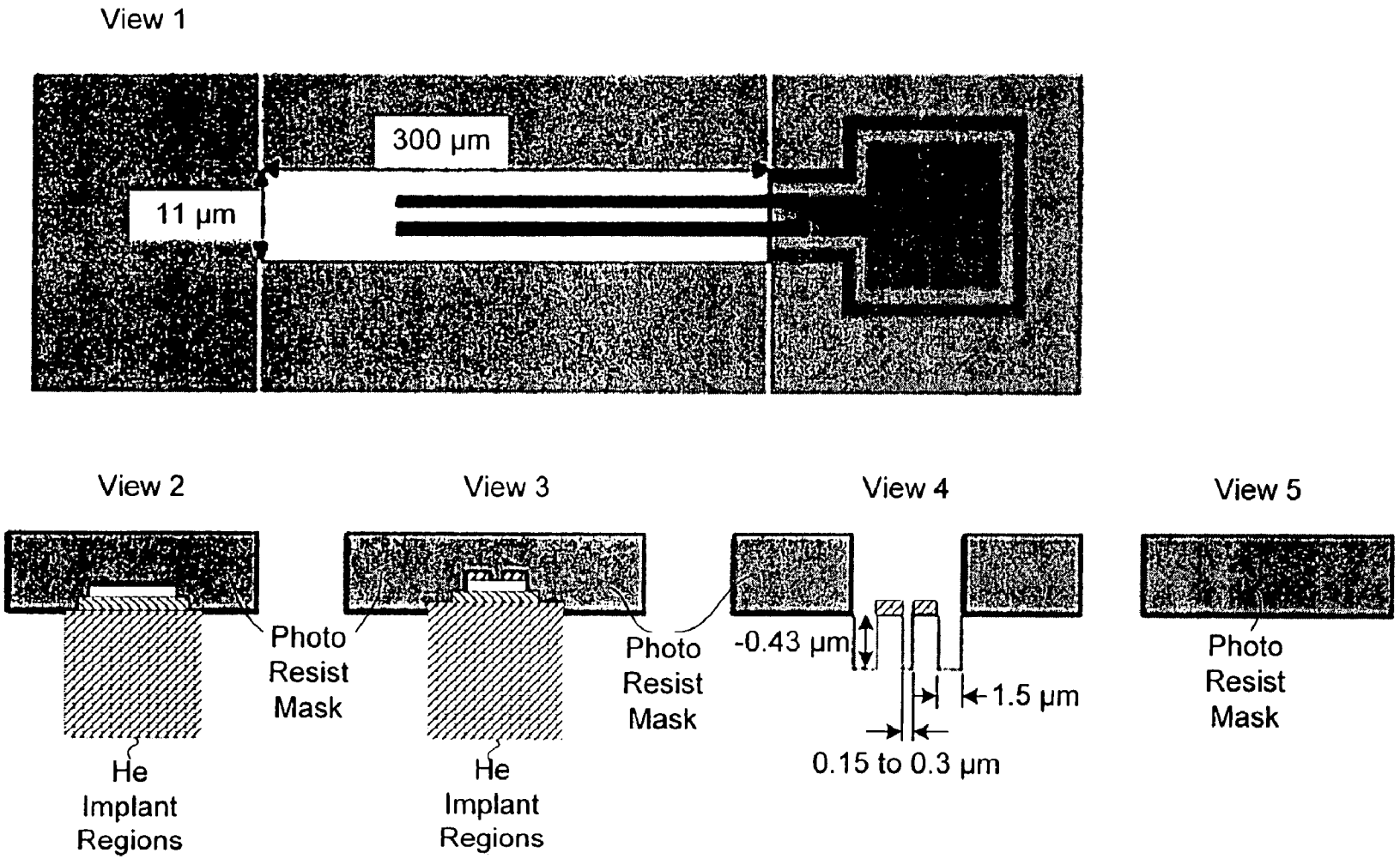

In one such particular embodiment for high power operation, 20 fingers could be used. These fingers shall be 40–200 μm long and varying width (0.15–0.3 μm). The metal on top of these fingers can be, for example, Schottky, Ni/Pt/Ni (200/500/500 Å), where the final Ni layer is used as an etch mask since it was found to withstand a chlorine etch well. This is followed by the base etch similar to step 9. The settings of this etch shall be ICP, ~0.43 μm in depth using pure $Cl_2$ chemistry, 400 W ICP power, and 200 eV ion energies. The low bias voltage is used to provide a slow and accurate etch depth. The structure resulting from the base etch following collector metal deposition (with photo resist) is shown in FIG. 5a. The decreased etch depth (0.43 μm) is due to an additional etch step that is needed and will be described next.

A base metal deposition as given in step 9b isolates the base metal from the GaN material on the sides of the collector fingers so an additional etching after the $SiN_x$ deposition is needed to expose the sidewalls of the collector fingers, and to allow better base metal contact and, therefore, better base voltage control of the collector current resulting in higher transconductance in the device. This deposited $SiN_x$ is, for instance, less than 500 Å via PECVD. This thickness is decreased since the minimum base region width is 1500 Å and 1000 Å of $SiN_x$ on both sides would completely close the base region. This additional etch is a two-stage etch.

Figure 5B:
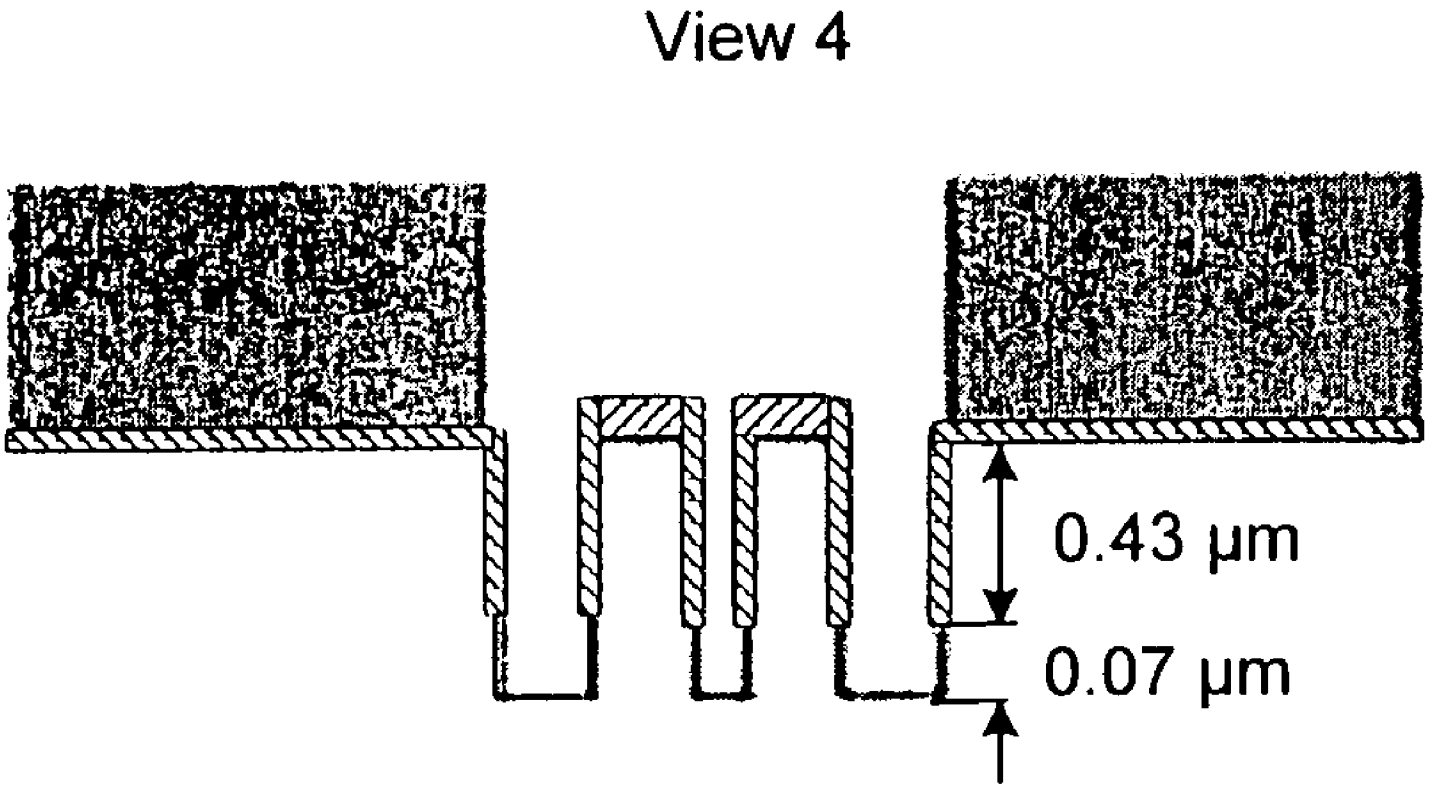

First, a $CH_4$—$O_2$ mix is used via RIE to directionally remove the $SiN_x$ since $Cl_2$ has a much faster etch rate on GaN than on $SiN_x$. Following $SiN_x$ removal, an ICP base etch for collector finger contact will be used to etch the GaN 0.07 μm as shown in FIG. 5b. The 0.07 μm depth is exactly the thickness of the subsequent metal deposition to prevent shorting of any metal that accidentally deposits on the sidewalls or in case the metal deposition is slightly thicker than expected. After this additional base etch for collector finger contact, the base is metallized with Ni/Pt (300/400 Å). Following this, all steps can be as previously discussed.

Figure 6A:
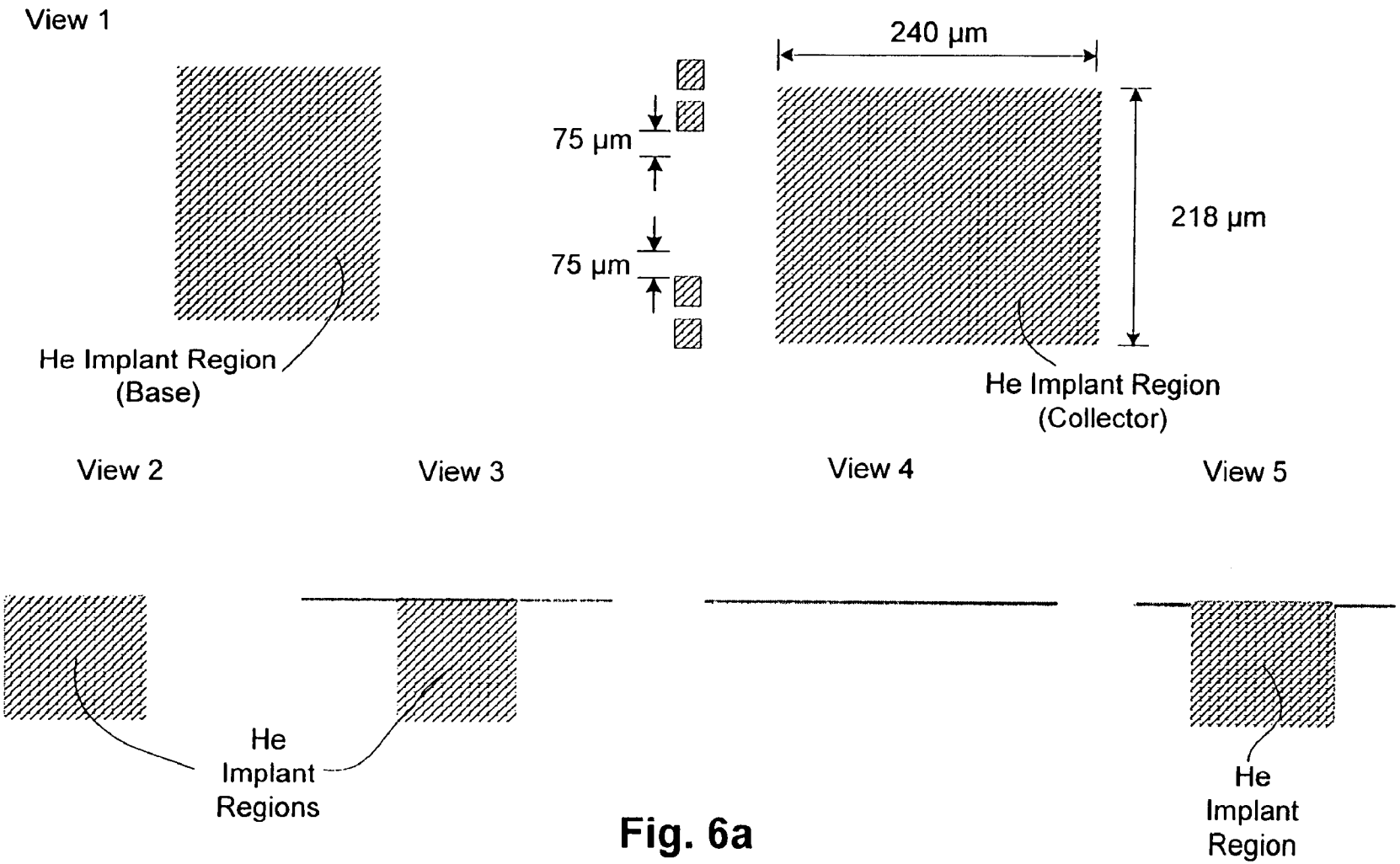

A fourth variation of the fabrication process includes the initial deposition of Ti/Al/Pt alignment markers. The addition of Al is to create an ohmic contact at the first layer for ohmic circular transmission line measurement (CTLM) and Schottky diode test structures that will be employed since the e-beam writer cannot write large areas during definition of the collector regions (otherwise, the first ohmic deposition). The addition of Al will not affect the e-beam alignment with the thick Pt (e.g., 1500 Å) deposited. He implantation under both base and collector contact pads is used due to the high conductivity of the material. This is shown in FIG. 6a. The placement of the e-beam alignment markers is also given. Each alignment box is 4 μm×4 μm. Note that they are 75 μm from the region to be written, due to the stringent requirements of the ebeam writing tool.

Figure 6B:
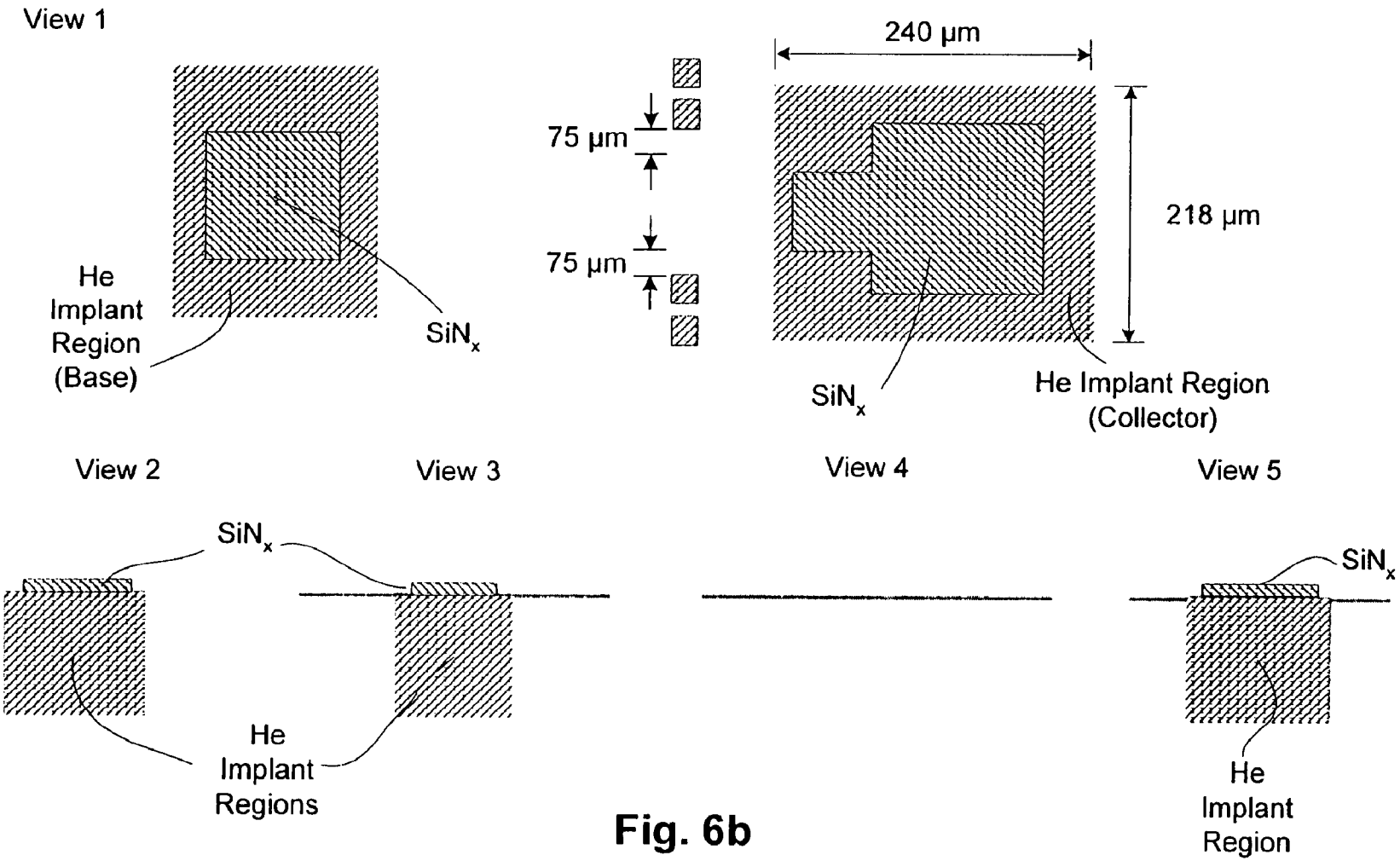
Figure 6C:
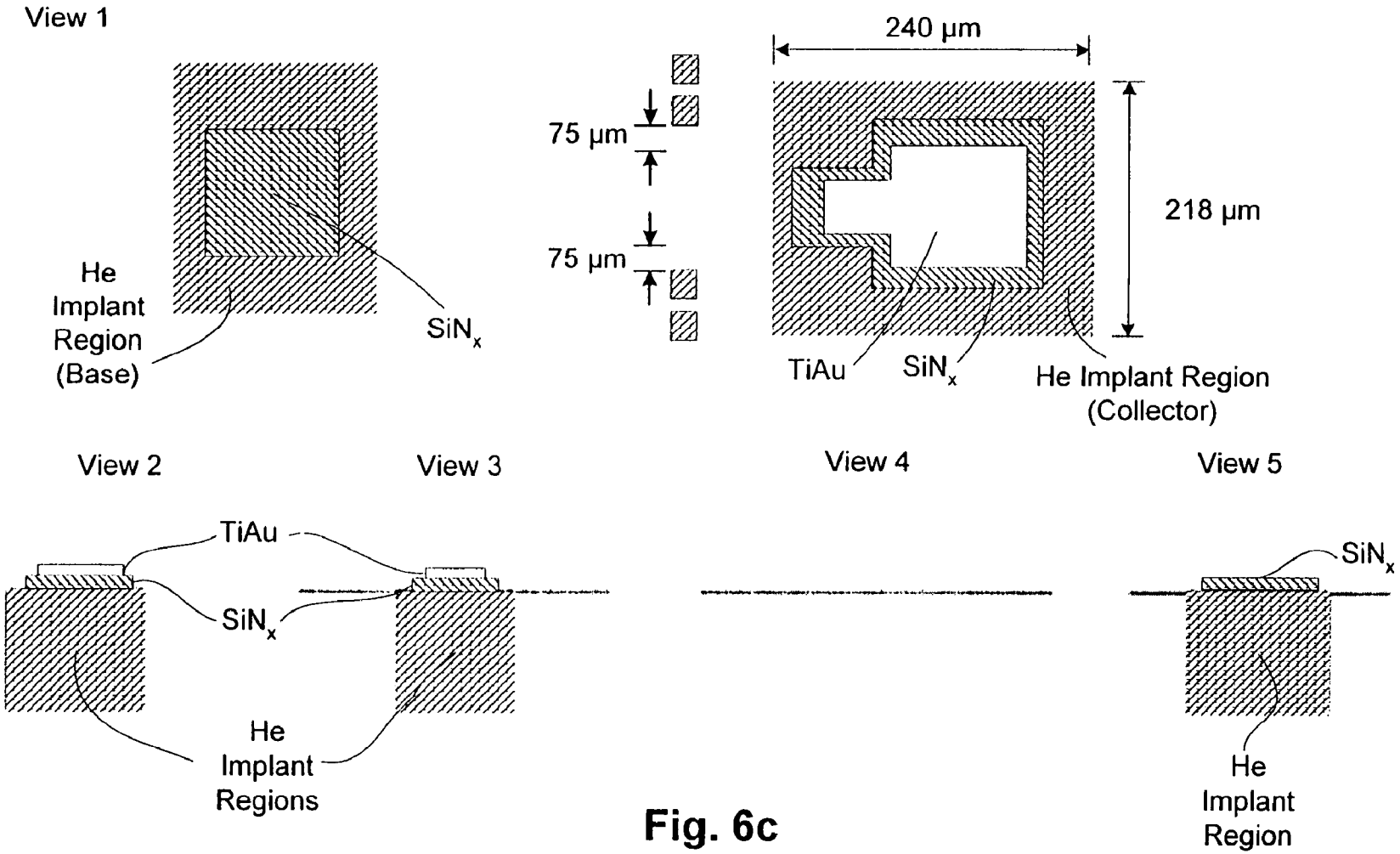
Figure 6D:
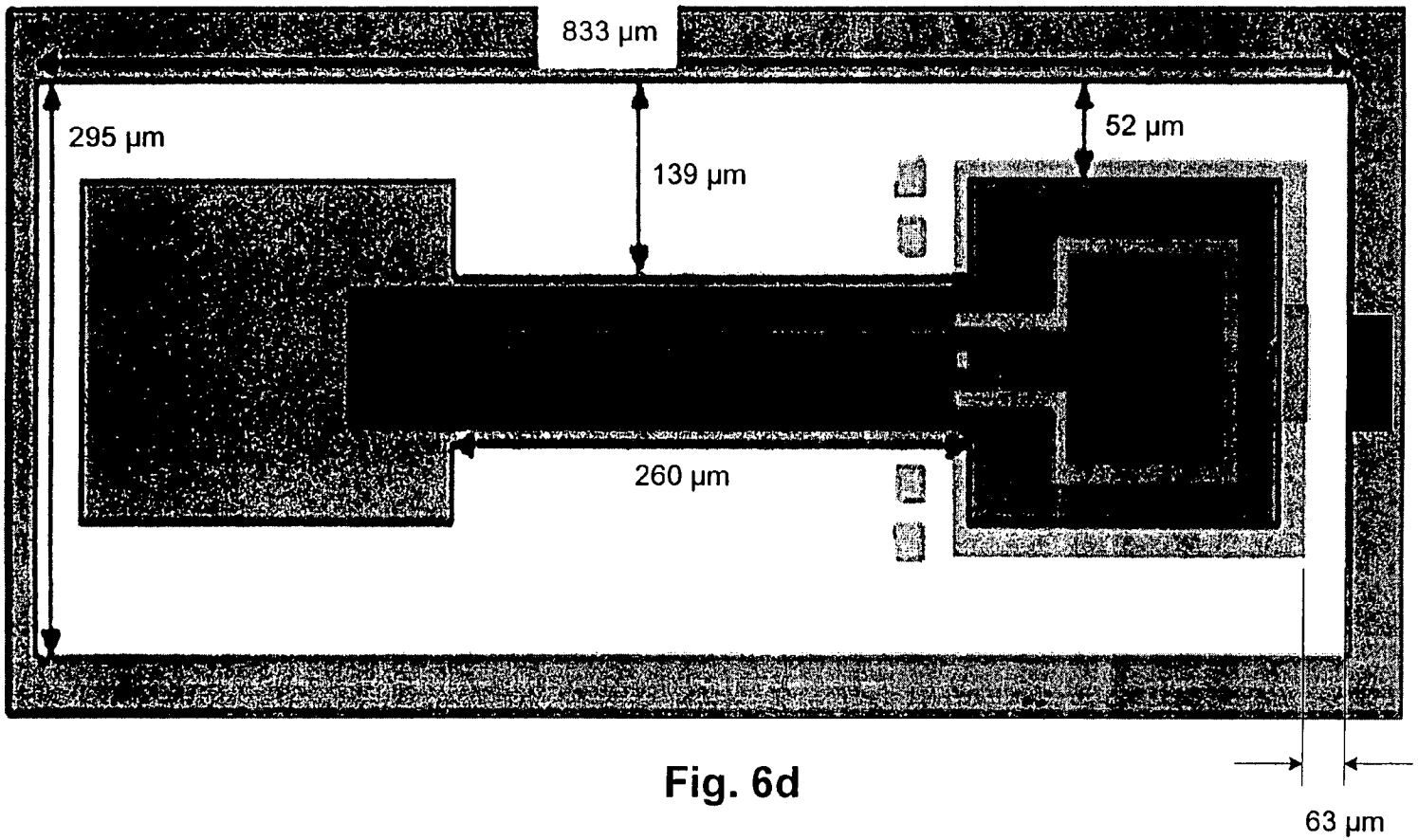

The first $SiN_x$ deposition is similar to previous versions with the exception that it is now included under the base contact pad (as well as the collector pad) as shown in FIG. 6b. This is a double safeguard for pad isolation. Now referring to FIG. 6c, note that the metal deposition shown on the collector pad is altered. Ni and Pt are both high stress films, so Ti/Au was chosen as a replacement since Ti is low stress and Au prevents oxidation to underlying metals. In one particular embodiment, these are deposited at 500/1000 Å, respectively.

Collector fingers were also changed from Schottky to ohmic since collector and base metals were no longer to be deposited simultaneously. The new metal scheme is Ti/Ni (100/400 Å). Process tests support the use of a thicker Ni layer and removal of the Al layer and are the reason for this increase in thickness. This thin metal is the maximum thickness allowed with the thin (e.g., 1500 Å) e-beam resist needed for fine features (e.g., 0.15 μm). Following this metal liftoff, $SiN_x$ is deposited (as previously described with the two stage etch).

Figure 6E:
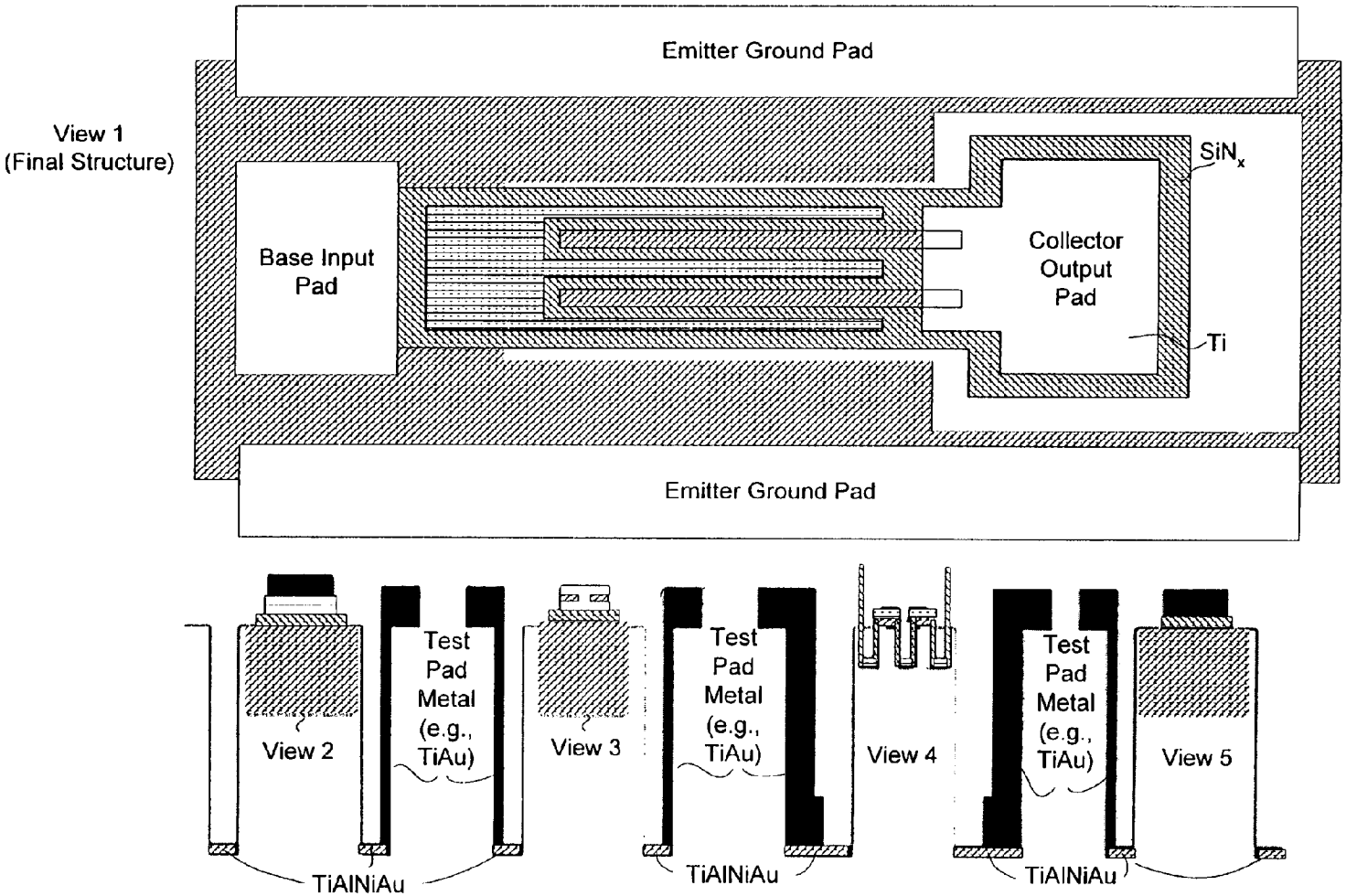

After the base metallization, the emitter is etched. This requires a thick resist of, for instance, AZ4620 of about 4 μm. Dimensions of the emitter etch are given in FIG. 6d, and the final device structure is shown in FIG. 6e.

Figure 7:
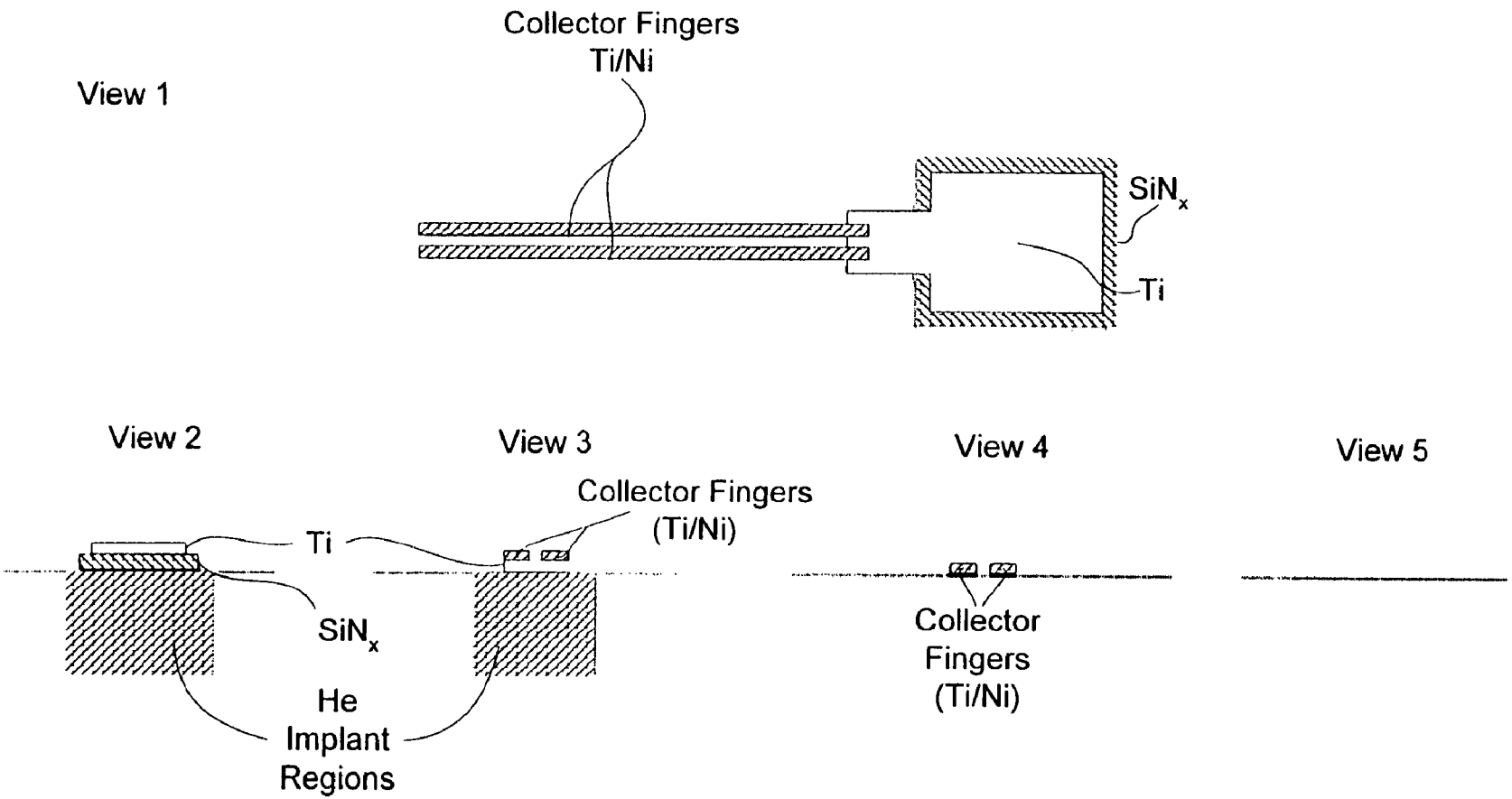

A fifth variation of the fabrication process includes a modification to the silicon nitride pad deposited in steps 5, 5a, and 5b. In this alternative embodiment, the $SiN_x$ pad is square such that, the He implanted region will extend out to the collector fingers, and no SiN will be under the fingers. This will reduce the difference in height between the fingers in the collector pad region (e.g., view 3 of FIG. 2b) relative to the height of the fingers out of the collector pad region (e.g., view 4 of FIG. 2b), which helps to prevent the metal fingers from disconnecting from the collector pad due to a significant difference in height. One such alternative embodiment is shown in FIG. 7, where there is only a layer of titanium under the fingers at the collector pad region (and no SiN layer).

Thus, the height difference of the collector fingers in the collector region and the collector fingers out of the collector region is about one layer of titanium.

Figure 8:
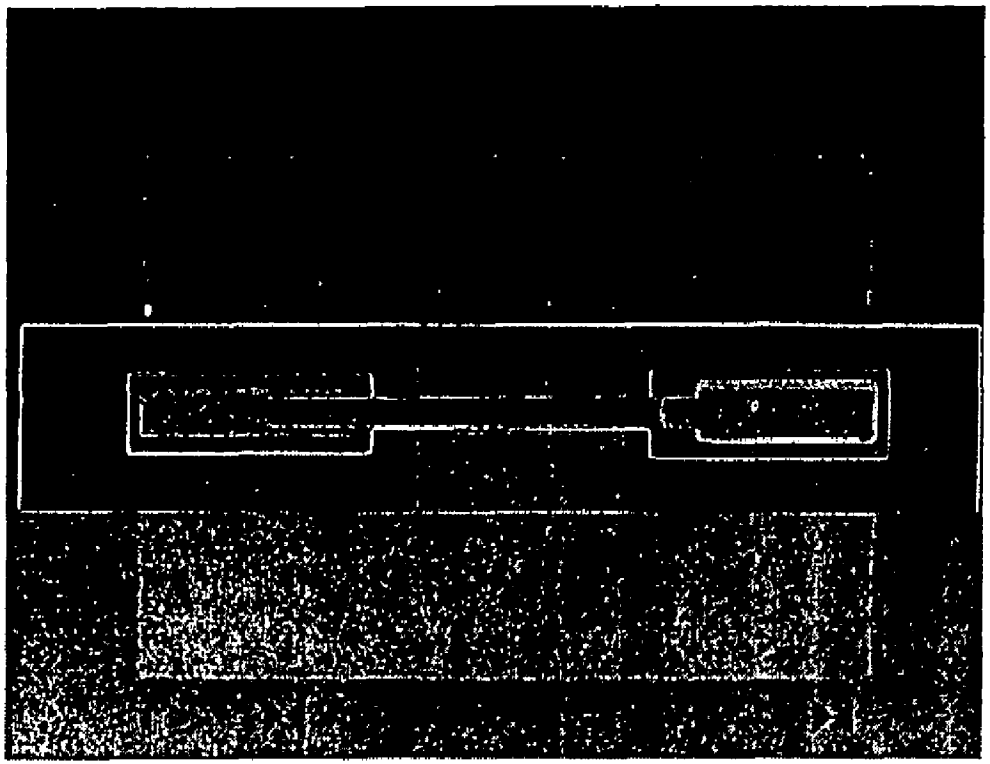
FIG. 8 is a top plan view SEM picture of a completed GaN PBT device fabricated in accordance with an embodiment of the present invention.

FIG. 8 shows a top view SEM picture of a completed PBT device configured in accordance with the present invention. As can be seen, high accuracy in the alignment of the different mask layers was achieved since the devices were processed with an optical lithography alignment tolerance in the order of 1.5 μm. This tolerance is much smaller than the usual limit for this technique.

Figure 9:
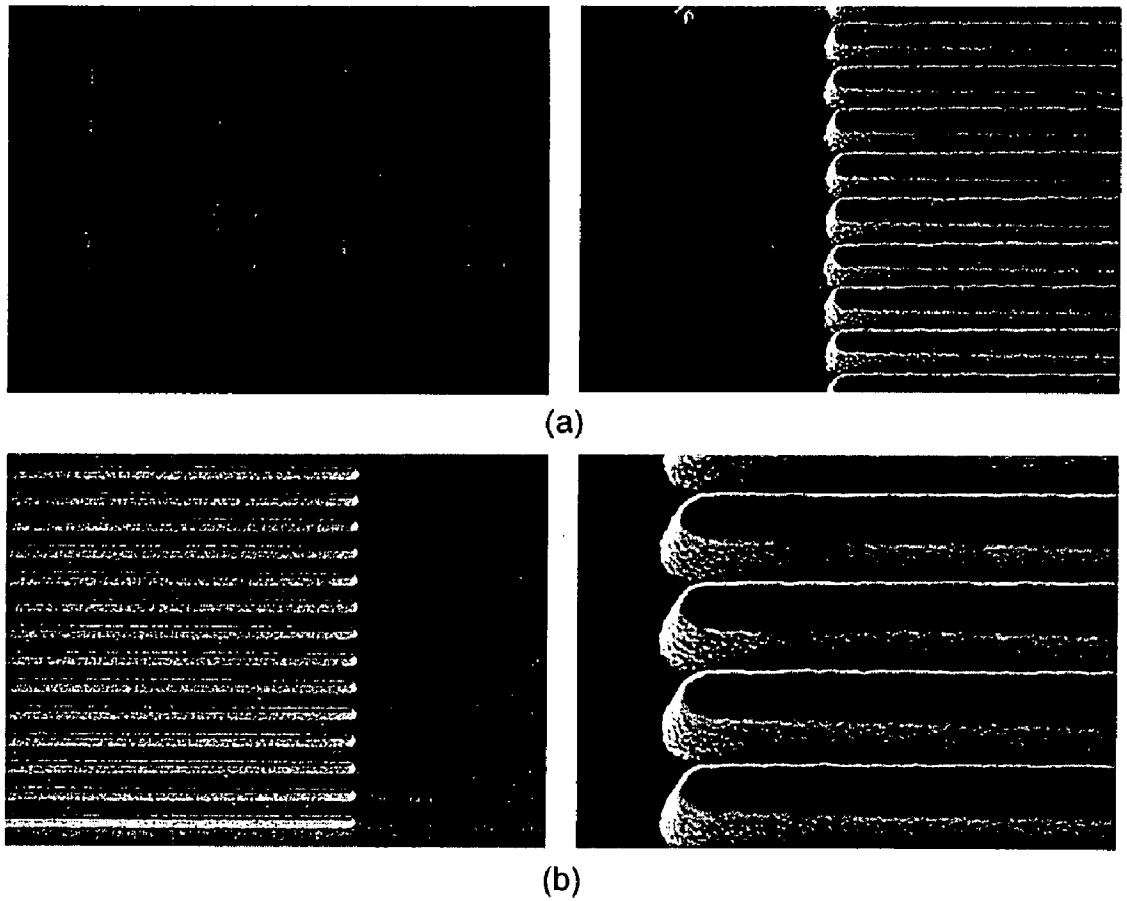
FIG. 9 (a and b) are SEM pictures showing a GaN PBT device fabricated in accordance with an embodiment of the present invention, with FIG. 9a showing a 1:1 finger pitch, and FIG. 9b a 1:3 finger pitch.

FIG. 9 shows detailed SEM images of the collector finger of two different devices, with device (a) having 1:1 finger pitch and device (b) having 1:3 finger pitch. One half the finger width (0.2 μm/2) is the effective device channel and the base contact thickness (600 Å) is the equivalent gate length. Note that these values are very small when compared to the conventional FET device features. Further note that a ramp down from −400V bias to −200V bias during the etch step produced a fairly smooth etched base surface. A finger side-wall angle of approximately 85° was achieved, which is highly anisotropic. A nickel metal layer thickness of 400 Å acted as an excellent etch mask as can be appreciated by the uniform morphology of the finger structures.

Probing of the various CTLM test structures shows ohmic metal contacts which have specific contact resistivity, $\rho_c$, of about $3\times10^{-6}\Omega\cdot cm^2$, which is an indication of the excellent contact quality.

Figure 10:
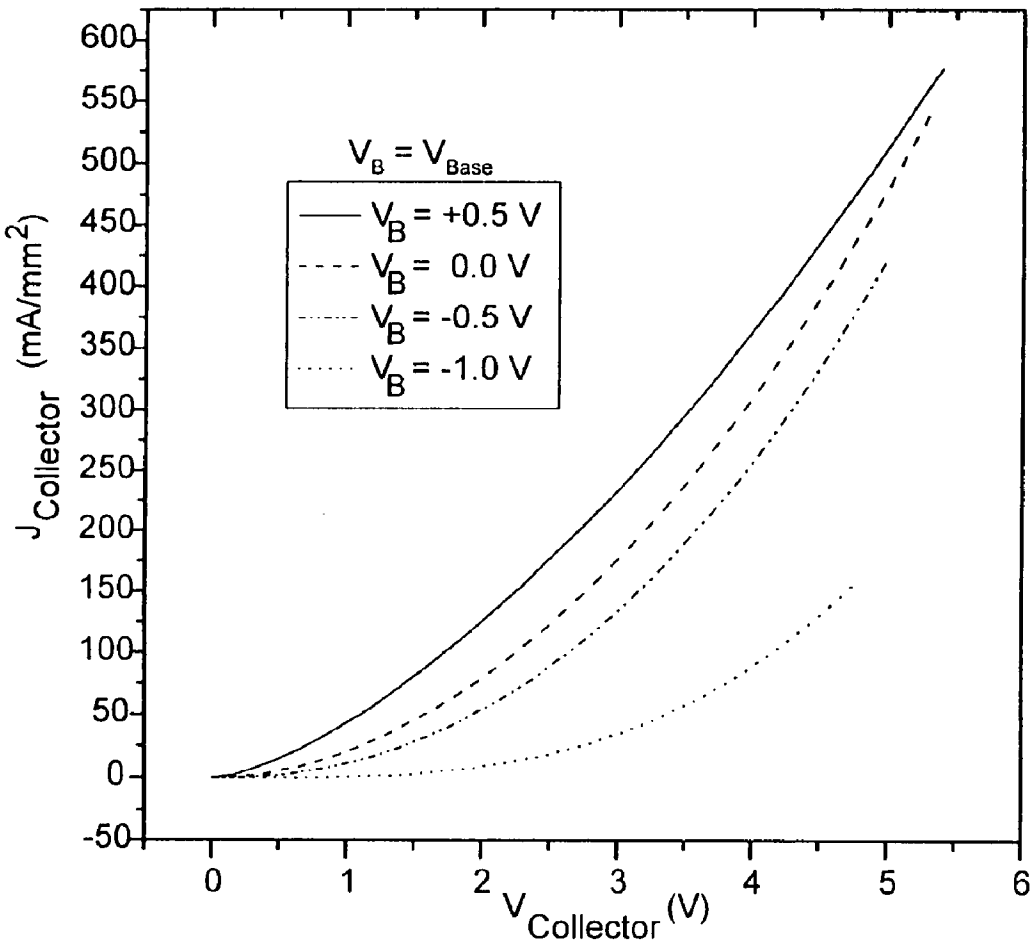
FIG. 10 is a graph showing a I–V characteristic curve of a GaN PBT device fabricated in accordance with an embodiment of the present invention.

The DC characteristic curve of a device with 1:1 finger pitch is shown in FIG. 10. The output characteristics have been measured for an applied base-emitter bias $V_{BE}$ ranging from +0.5 V to −1.0 V. The collector-emitter voltage $V_{CE}$ is in the 0 V to 5.5 V range. From the plot, it is evident that the base voltage controls the output current $I_C$, showing transistor action. For $V_{CE}$=+5.0 V and $V_{VE}$=+0.5V, a current density $J_C$ of up to 520 mA/mm$^2$ is achieved. DC testing of the devices shows good base control (modulation Of $I_{CE}$), and current densities of up to 450 mA/mm$^2$ were achieved for a $V_{CE}$ of 5.0V.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method for fabricating an etched grooved GaN-based permeable-base transistor device, comprising:

opening a window for helium implantation on a hydride vapor phase epitaxy (HVPE) grown n$^+$ GaN quasi-substrate layer, using optical lithography;

implanting helium on the [n+] *n*$^+$ GaN quasi-substrate layer over the window for helium implantation, so as to provide an *approximately 2 μm thick* insulating layer for contact pads of the device;

opening a window for collector fingers using E-beam lithography;

depositing an ohmic metallization layer over the window for the collector fingers;

lifting-off ohmic metallization, thereby forming the collector fingers;

opening a window for a self-aligned base recess using optical lithography;

etching to recess a base layer to an n$^-$ GaN quasi-substrate layer grown on the n$^+$ GaN quasi-substrate layer, wherein the etching is performed with a ramp down in chuck bias voltage wherein said ramp down is from a high chuck bias voltage to a low chuck bias voltage;

opening a window for a collector contact pad, using optical lithography;

depositing a high quality silicon nitride layer over the window for a collector contact pad*, the high quality silicon nitride layer being about approximately 1000–2000 Å thick, and deposited over the window for helium implantation via plasma enhanced chemical vapor deposition* (*PECVD*); and lifting-off or wet chemical etching the high quality silicon nitride layer, thereby forming a silicon nitride collector contact pad.

[2. The method of claim 1 wherein the high quality silicon nitride layer is about approximately 1000–2000 Å thick, and is deposited over the window for helium implantation via plasma enhanced chemical vapor deposition (PECVD).]

3. The method of claim 1 further comprising:

opening a window for Ti metallization of the collector contact pad using optical lithography;

depositing Ti over the window for Ti metallization of the collector contact pad; and lifting-off Ti metallization, thereby forming a Ti collector contact pad.

4. The method of claim 3 further comprising:

opening a window for a second Ti metallization of the collector contact pad using optical lithography;

depositing Ti over the window for the second Ti metallization of the collector contact pad; and lifting-off second Ti metallization, thereby forming a Ti cap over the collector contact pad.

5. The method of claim 1 wherein depositing Ti over the window for Ti metallization of the collector contact pad includes depositing Ti/Au at thicknesses of about approximately 500 Å/1000 Å, respectively, using e-beam evaporation.

6. The method of claim 1 further comprising:

opening an emitter etch/contact window using optical lithography;

etching an emitter recess to the n$^+$ GaN quasi-substrate layer;

depositing an emitter ohmic metallization layer over the etched emitter recess; and lifting-off emitter ohmic metallization, thereby forming an emitter contact pad.

7. The method of claim 1 wherein the emitter ohmic metallization layer includes at least one of titanium, aluminum, nickel, and gold.

8. The method of claim 1 wherein the helium implantation is achieved with an implant depth of about approximately 2 μm.

9. The method of claim 1 wherein the ohmic metallization layer over the window for the collector fingers is Ti/Ni with thicknesses of 100 Å and 400 Å, respectively.

10. The method of claim 1 wherein the device has a plurality of collector fingers about approximately [0.2 Å] *0.2 μm* wide and having a finger pitch between 1:1 and 1:3.

11. A method for fabricating an etched grooved GaN-based permeable-base transistor device, comprising:

opening a window for helium implantation on a hydride vapor phase epitaxy (HVPE) grown n$^+$ GaN quasi-substrate layer, using optical lithography;

implanting helium *with an implant depth of about approximately 2 μm* on the [n+] *n*$^+$ GaN quasi-substrate layer over the window for helium implantation, so as to provide an insulating layer for contact pads of the device;

opening a window for collector fingers using E-beam lithography;

depositing an ohmic metallization layer over the window for the collector fingers;

lifting-off ohmic metallization, thereby forming the collector fingers;

opening a window for a self-aligned base recess using optical lithography;

etching to recess a base layer to an $n^-$ GaN quasi-substrate layer grown on the $n^+$ GaN quasi-substrate layer, wherein the etching is performed with a ramp down in chuck bias voltage; depositing conformal silicon nitride for passivation of the recessed base layer;

directionally etching to remove silicon nitride on planes parallel to the $n^+$ GaN quasi-substrate layer;

depositing a base metallization layer; and lifting-off base metallization, thereby forming a base contact pad.

12. The method of claim 11 further comprising base metallization and wherein an anneal is performed after said base metallization so as to provide the base contact pad with low reverse current leakage and low contact resistance.

13. The method of claim 11 wherein an emitter ohmic metallization layer includes at least one of titanium, aluminum, nickel, and gold.

[14. The method of claim 11 wherein the helium implantation is achieved with an implant depth of about approximately 2 μm.]

15. The method of claim 11 wherein the ohmic metallization layer over the window for the collector fingers is Ti/Ni with thicknesses of 100 Å and 400 Å, respectively.

16. The method of claim 11 wherein the device has a plurality of collector fingers about approximately 0.2 μm wide and having a finger pitch between 1:1 and 1:3.

* * * * *